(12) United States Patent
Hitaka et al.

(10) Patent No.: US 11,075,315 B2
(45) Date of Patent: Jul. 27, 2021

(54) OPTICAL SEMICONDUCTOR ELEMENT AND METHOD OF MANUFACTURING OPTICAL SEMICONDUCTOR ELEMENT

(71) Applicant: HAMAMATSU PHOTONICS K.K., Hamamatsu (JP)

(72) Inventors: Masahiro Hitaka, Hamamatsu (JP); Akio Ito, Hamamatsu (JP); Tatsuo Dougakiuchi, Hamamatsu (JP); Kazuue Fujita, Hamamatsu (JP); Tadataka Edamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/386,604

(22) Filed: Apr. 17, 2019

(65) Prior Publication Data
US 2019/0326466 A1    Oct. 24, 2019

(30) Foreign Application Priority Data

Apr. 20, 2018   (JP) ............................. JP2018-081549

(51) Int. Cl.
*H01L 31/18*       (2006.01)
*H01L 31/173*      (2006.01)
*H01S 5/34*        (2006.01)
*H01L 31/0352*     (2006.01)
*H01L 31/0224*     (2006.01)
(Continued)

(52) U.S. Cl.
CPC ......... *H01L 31/173* (2013.01); *G01N 21/255* (2013.01); *H01L 31/022408* (2013.01); *H01L 31/03046* (2013.01); *H01L 31/035236* (2013.01); *H01L 31/1844* (2013.01); *H01S 5/0208* (2013.01); *H01S 5/0262* (2013.01); *H01S 5/0425* (2013.01); *H01S 5/22* (2013.01); *H01S 5/3402* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2008/0212636 A1* | 9/2008 | Sato | ........................ H01S 5/423 372/50.11 |
| 2010/0284432 A1* | 11/2010 | Hoshino | .................. H01S 5/187 372/44.011 |
| 2014/0034977 A1* | 2/2014 | Yang | ................... H01L 29/0649 257/93 |

OTHER PUBLICATIONS

Benedikt Schwarz et al., "High performance bi-functional quantum cascade laser and detector," Applied Physics Letters, 2015, pp. 071104-1-071104-4, vol. 107.

* cited by examiner

*Primary Examiner* — Moin M Rahman
(74) *Attorney, Agent, or Firm* — Faegre Drinker Biddle & Reath LLP

(57) ABSTRACT

An optical semiconductor element includes a semiconductor substrate, a first laminated structure provided on a front surface of the semiconductor substrate, and a second laminated structure provided on the front surface of the semiconductor substrate, the first laminated structure includes a first quantum cascade region, the second laminated structure includes a dummy region having the same layer structure as the first quantum cascade region, a second quantum cascade region provided on the front surface of the semiconductor substrate via the dummy region, and one of the first quantum cascade region and the second quantum cascade region is a (Continued)

quantum cascade laser, and the other of the first quantum cascade region and the second quantum cascade region is a quantum cascade detector.

16 Claims, 18 Drawing Sheets

(51) Int. Cl.
  *H01S 5/02*       (2006.01)
  *H01S 5/22*       (2006.01)
  *H01S 5/042*      (2006.01)
  *H01S 5/343*      (2006.01)
  *H01L 31/0304*    (2006.01)
  *G01N 21/25*      (2006.01)
  *H01S 5/026*      (2006.01)
(52) U.S. Cl.
  CPC ...... *H01S 5/34313* (2013.01); *H01S 5/34346* (2013.01); *G01N 2201/0612* (2013.01)

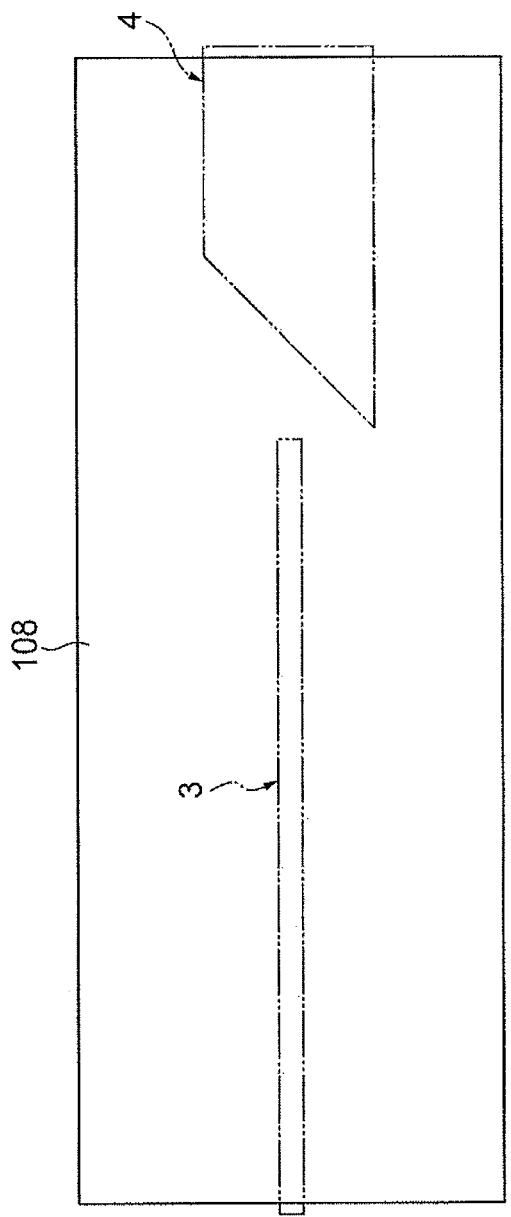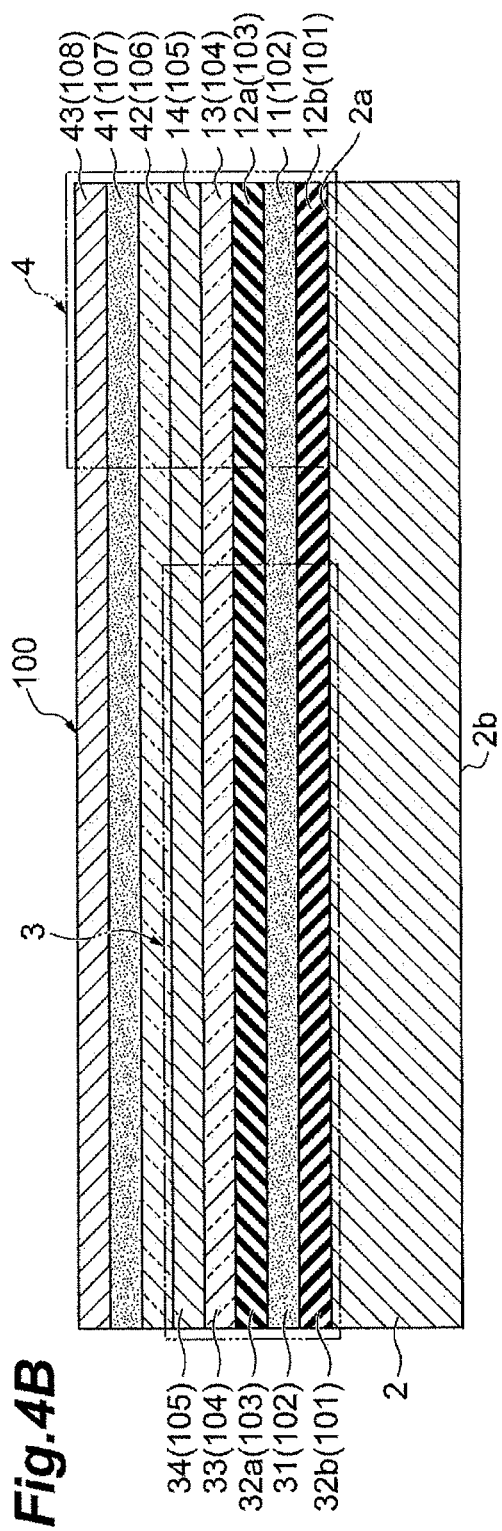
Fig.4A
Fig.4B

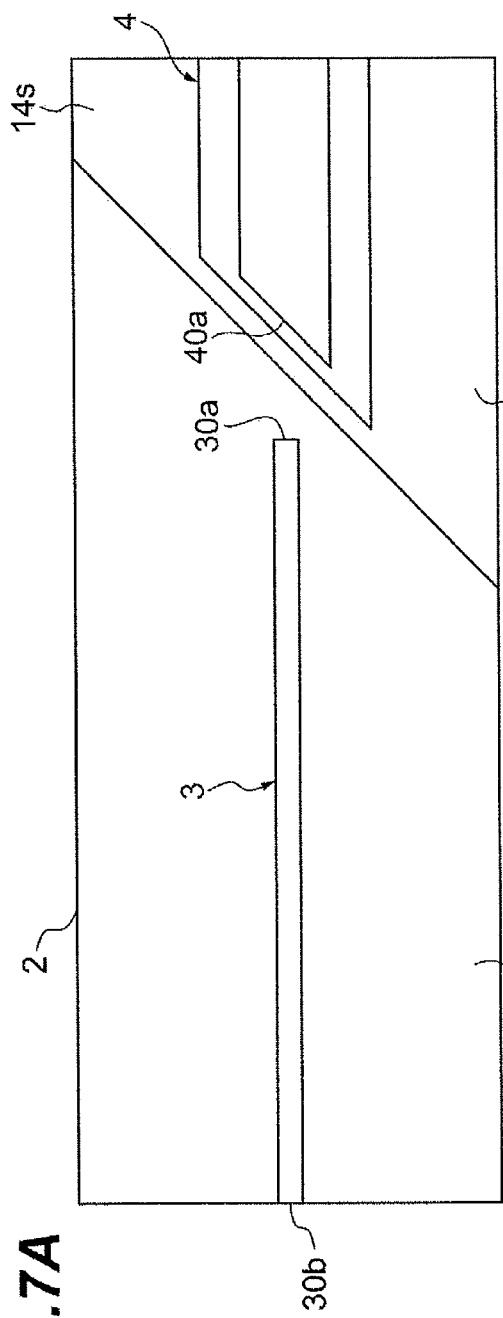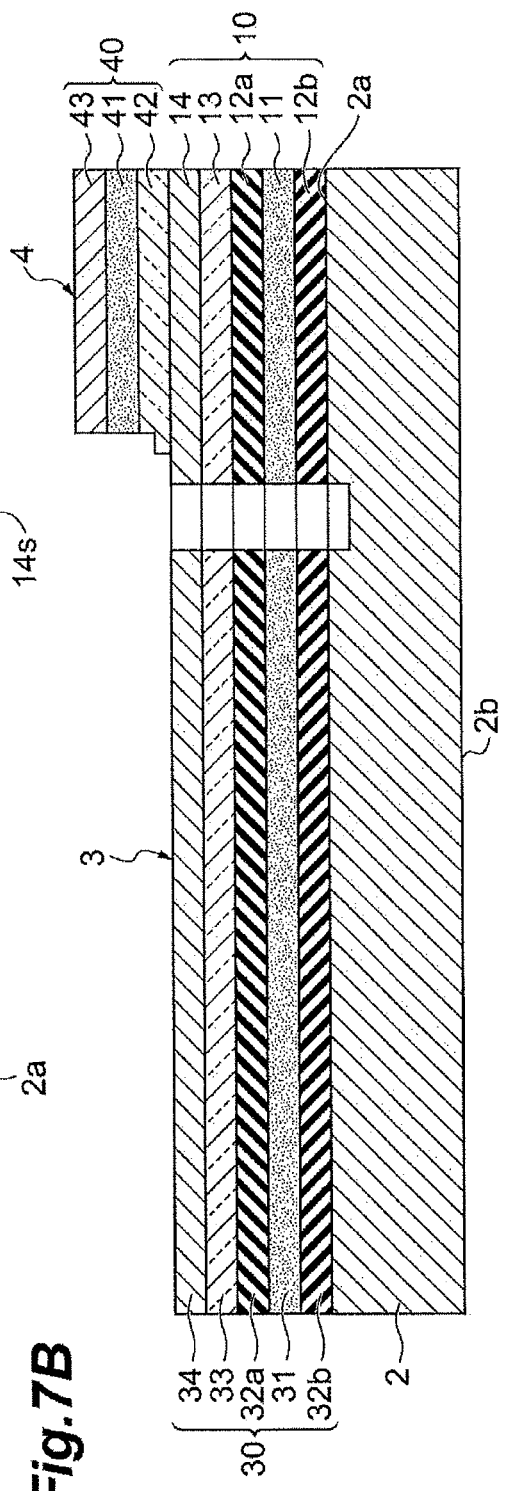

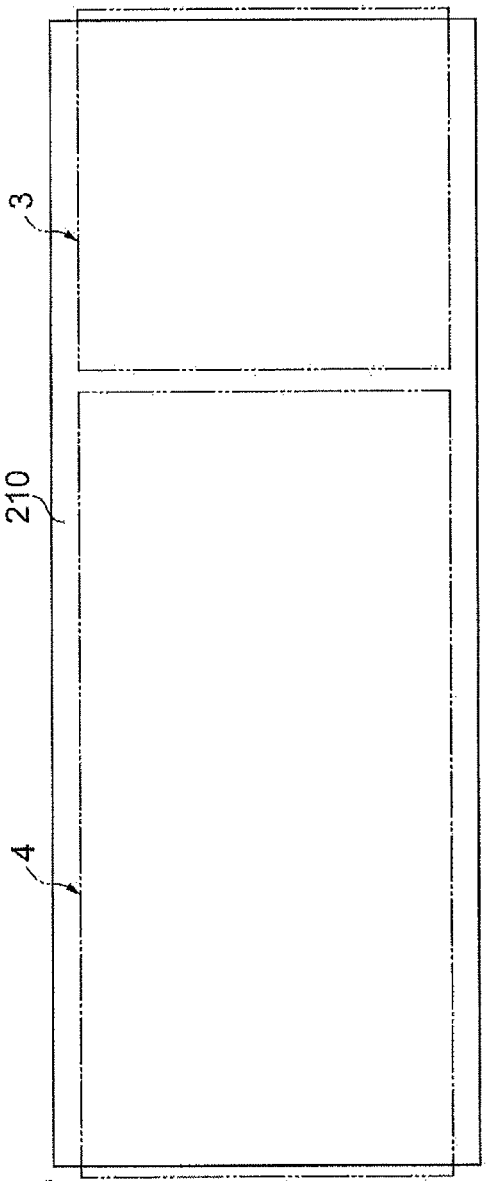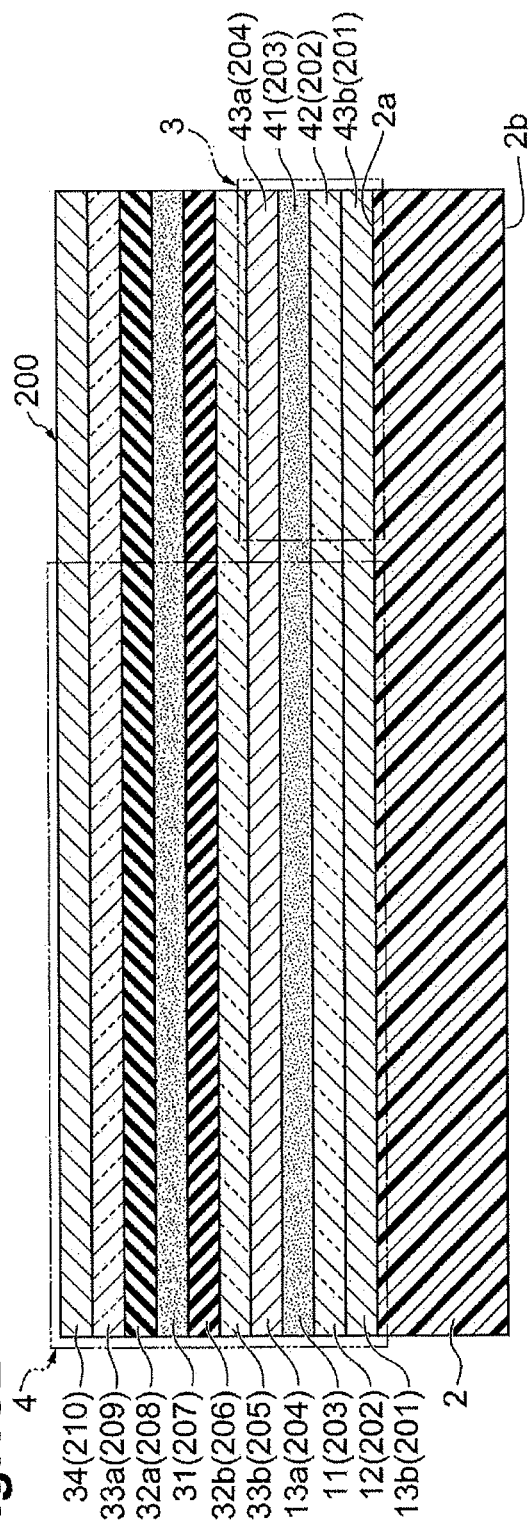

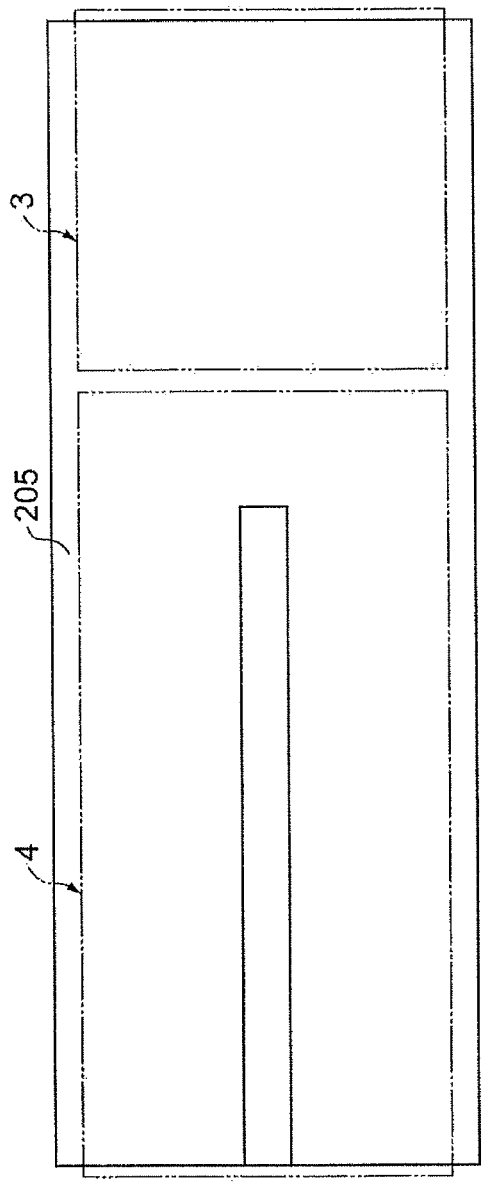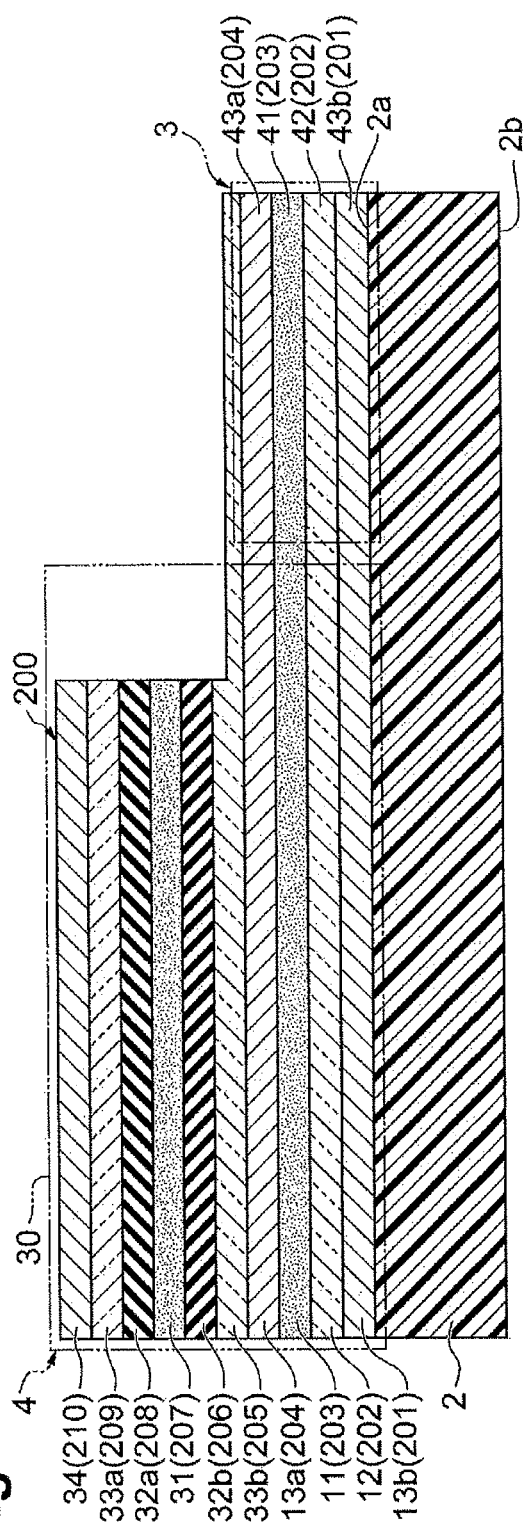

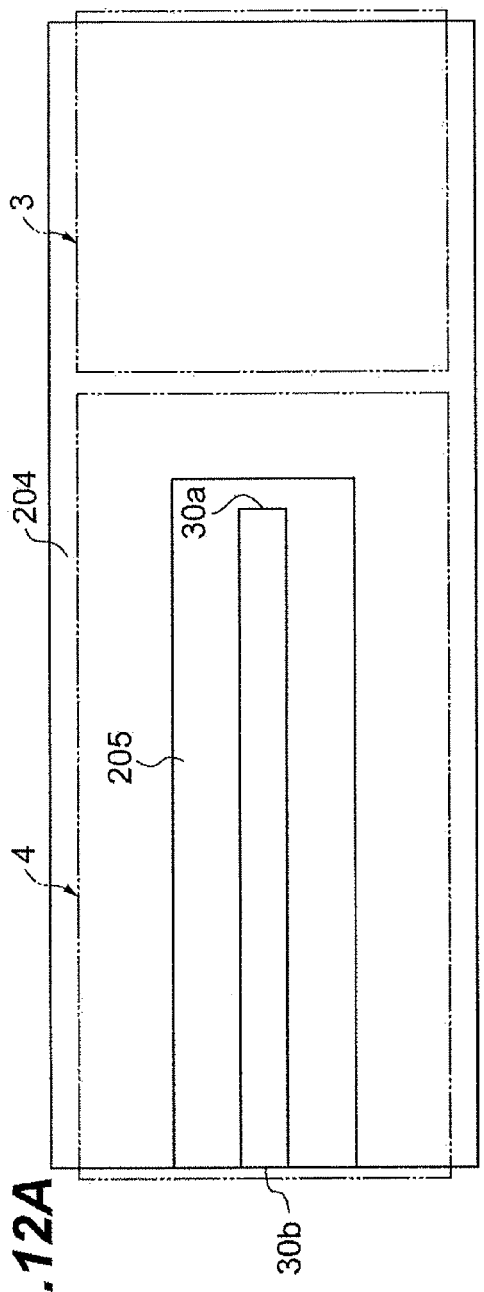
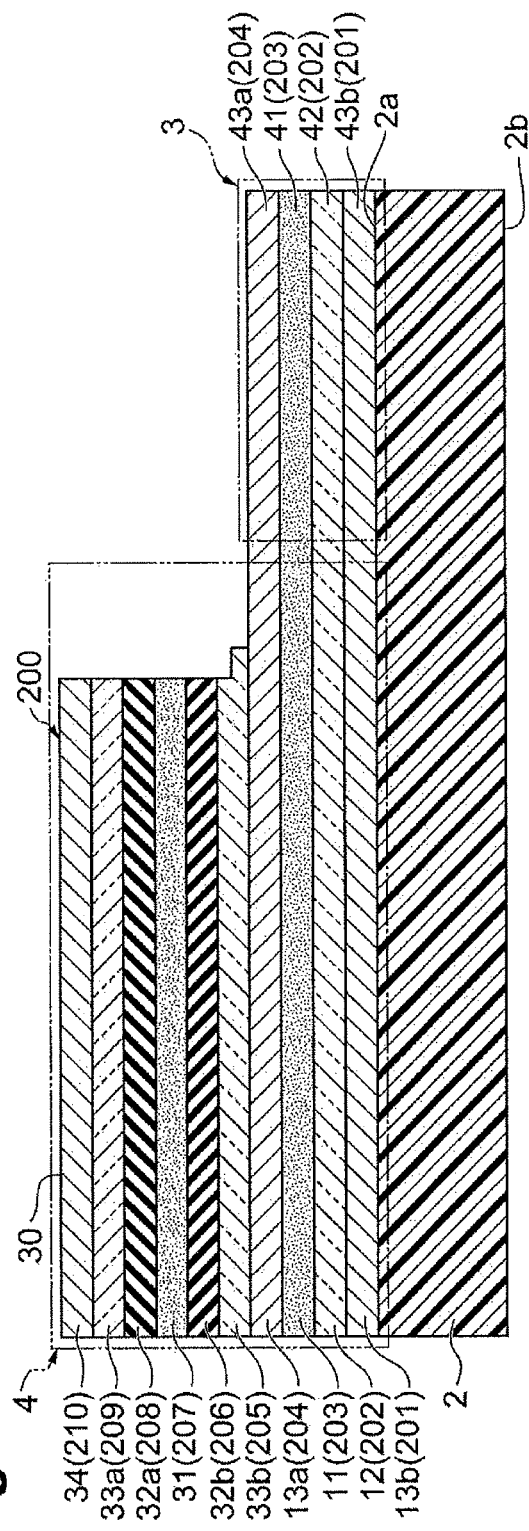

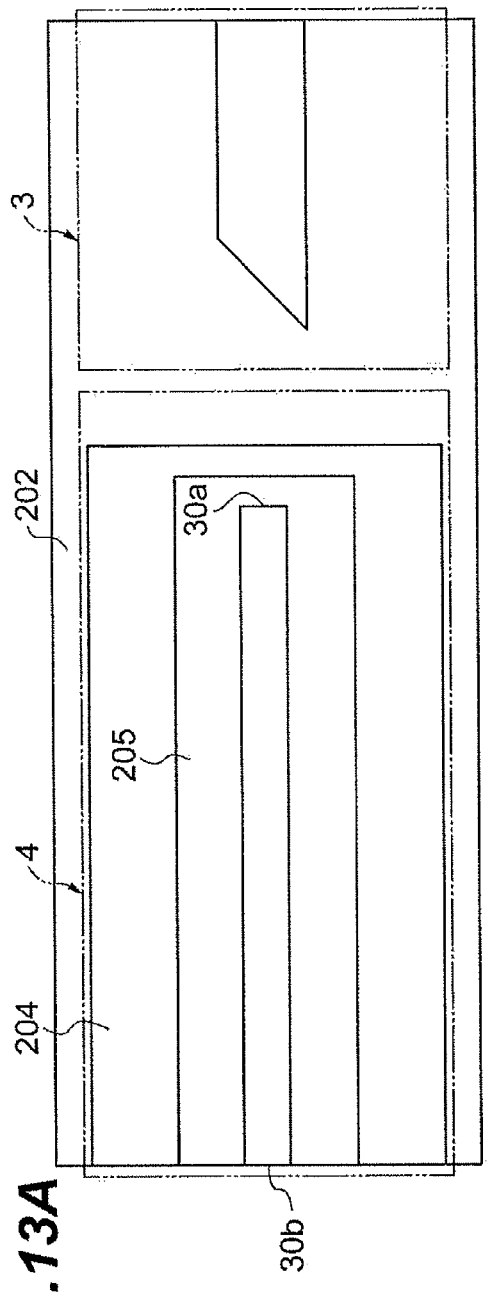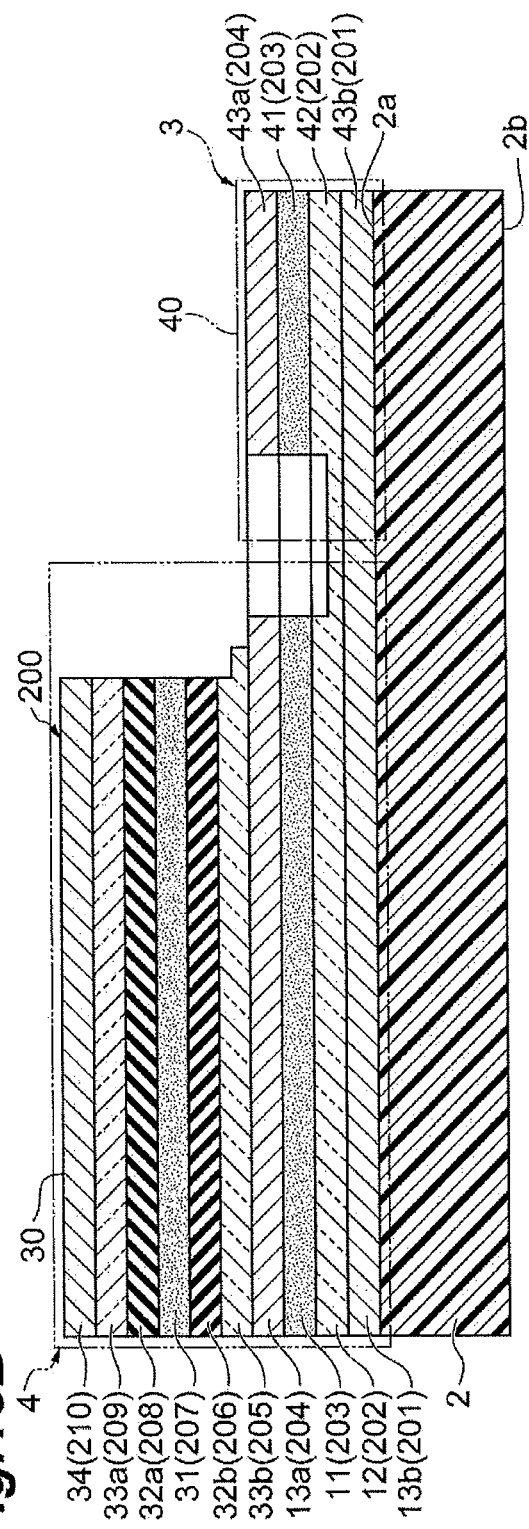

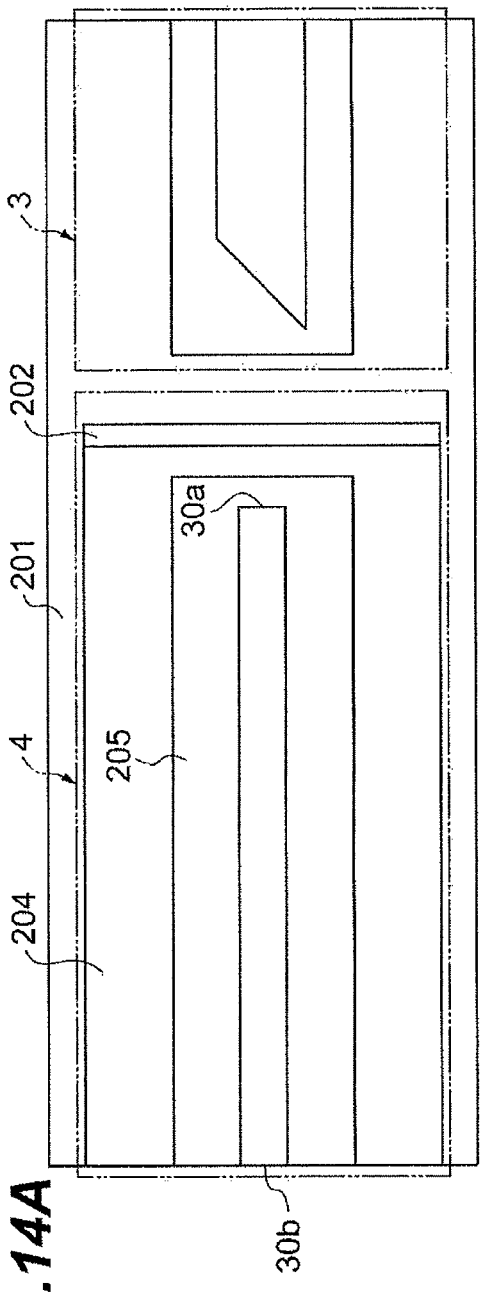
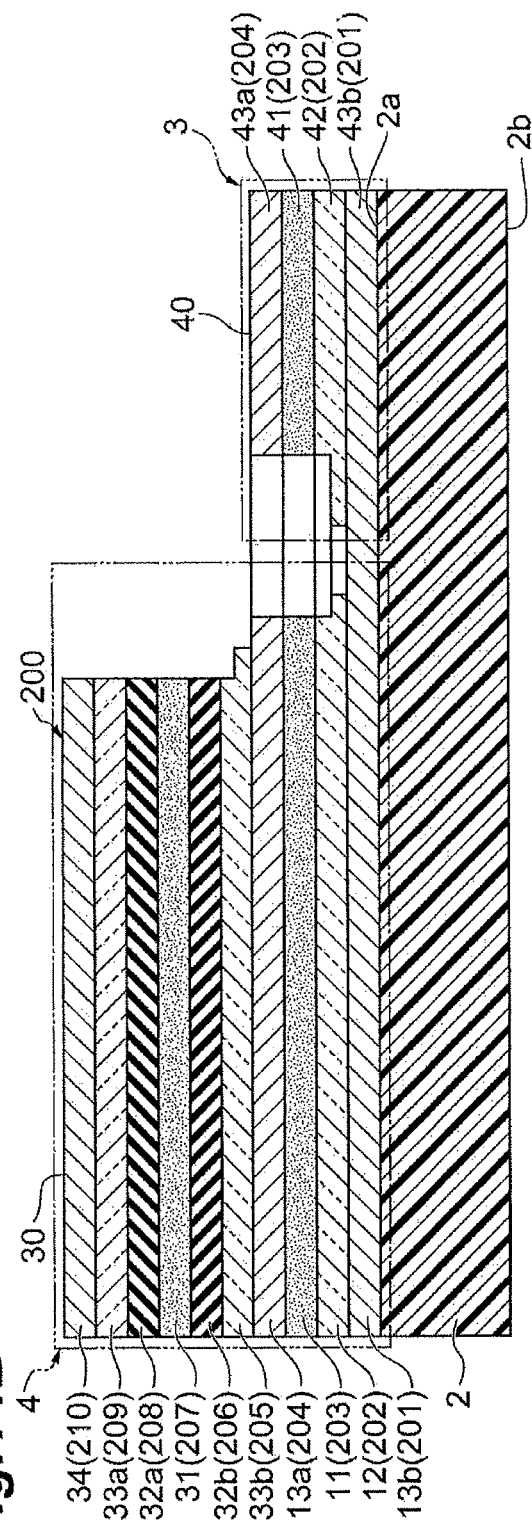
Fig. 14A
Fig. 14B

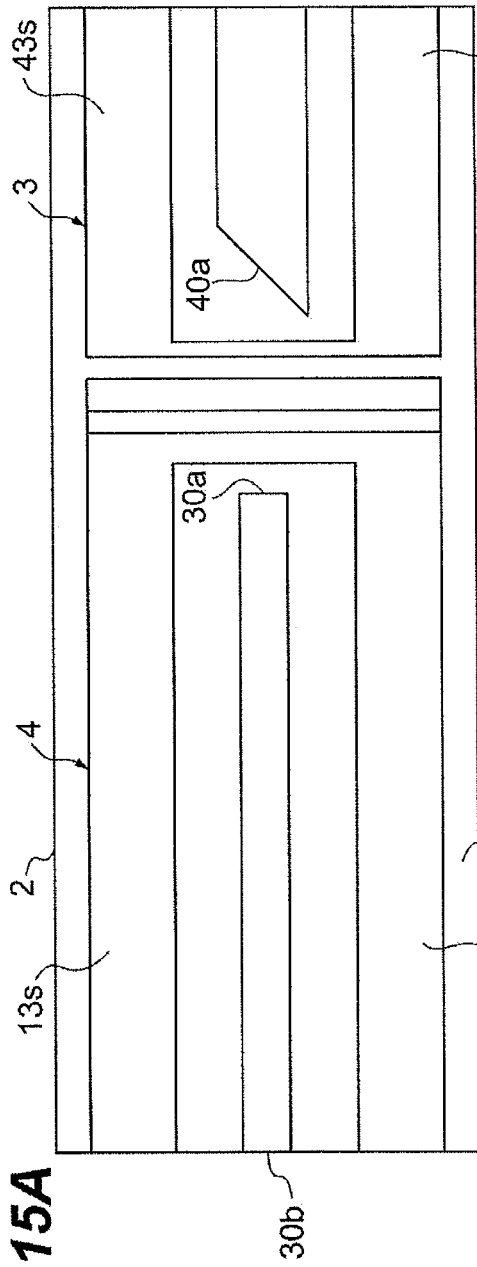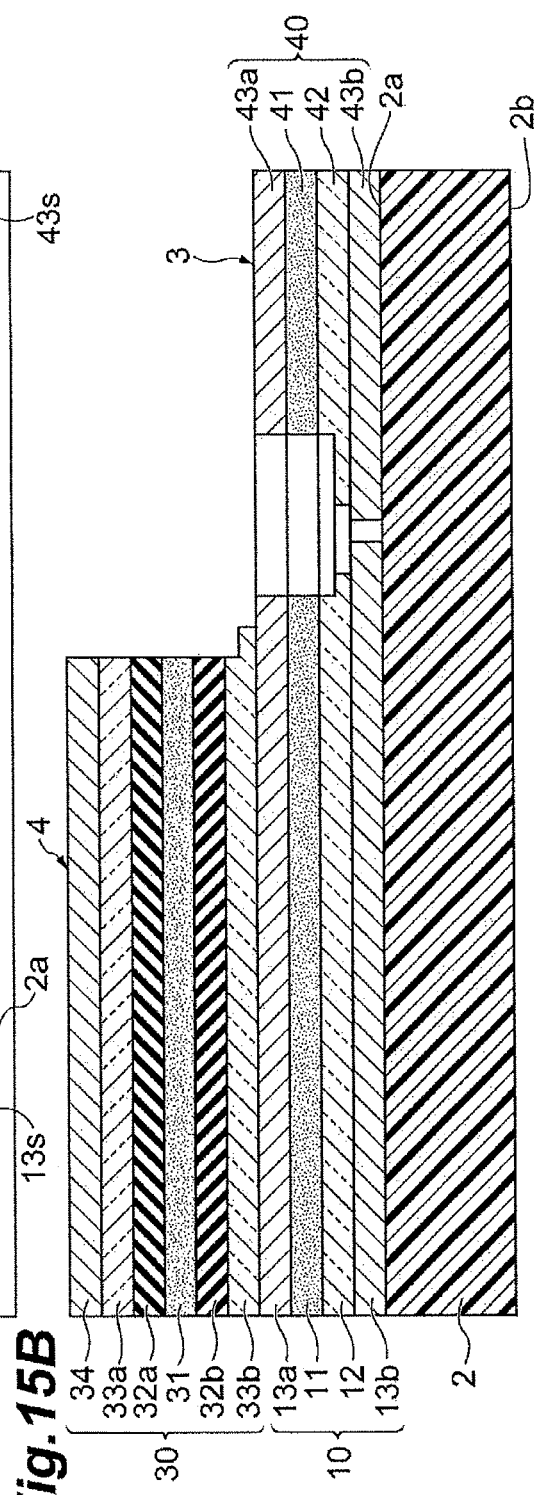

OPTICAL SEMICONDUCTOR ELEMENT AND METHOD OF MANUFACTURING OPTICAL SEMICONDUCTOR ELEMENT

TECHNICAL FIELD

This disclosure relates to an optical semiconductor element and a method of manufacturing an optical semiconductor element.

BACKGROUND

An optical semiconductor element in which a quantum cascade laser and a quantum cascade detector having the same layer structure are provided on one semiconductor substrate is known (see, for example, B. Schwarz et al. "High performance bi-functional quantum cascade laser and detector", APPLIED PHYSICS LETTERS 107, 071104 (2015)). According to such an optical semiconductor element, for example, laser light emitted from the quantum cascade laser is detected by the quantum cascade detector in a state in which a gas that is an analysis target is present between the quantum cascade laser and the quantum cascade detector such that a composition of the gas that is an analysis target can be analyzed.

SUMMARY

Since monolithic fabrication is possible through a semiconductor manufacturing process, the optical semiconductor element as described above becomes an element in which positional accuracy of the quantum cascade laser and the quantum cascade detector is very high. However, it is difficult to optimize characteristics of each of the quantum cascade laser and the quantum cascade detector because the quantum cascade laser and the quantum cascade detector are formed with the same layer structure.

An object of the present disclosure is to provide an optical semiconductor element and a method of manufacturing an optical semiconductor element capable of achieving optimization of characteristics of a quantum cascade laser and a quantum cascade detector.

An optical semiconductor element of the present disclosure includes a semiconductor substrate; a first laminated structure provided on a front surface of the semiconductor substrate; and a second laminated structure provided on the front surface of the semiconductor substrate, wherein the first laminated structure includes a first quantum cascade region, the second laminated structure includes a dummy region having the same layer structure as the first quantum cascade region, and a second quantum cascade region provided on the front surface of the semiconductor substrate via the dummy region, one of the first quantum cascade region and the second quantum cascade region is a quantum cascade laser, and the other of the first quantum cascade region and the second quantum cascade region is a quantum cascade detector.

In this optical semiconductor element, in the second laminated structure, the second quantum cascade region is provided on the front surface of the semiconductor substrate via the dummy region having the same layer structure as the first quantum cascade region. That is, the first quantum cascade region included in the first laminated structure and the second quantum cascade region included in the second laminated structure are located at different heights from the front surface of the semiconductor substrate. Accordingly, it is possible to achieve optimization of characteristics of one of the first quantum cascade region and the second quantum cascade region as a quantum cascade laser and to achieve optimization of characteristics of the other of the first quantum cascade region and the second quantum cascade region as a quantum cascade detector.

In the optical semiconductor element of the present disclosure, the first quantum cascade region may be the quantum cascade laser, and the second quantum cascade region may be the quantum cascade detector. With this configuration, it is possible to enhance heat radiation of the quantum cascade laser via the semiconductor substrate.

In the optical semiconductor element of the present disclosure, the semiconductor substrate may be an n-type or p-type semiconductor substrate, the first quantum cascade region may include a first active layer and a first contact layer provided on the side opposite to the semiconductor substrate with respect to the first active layer, the second quantum cascade region may include a second active layer, and a second contact layer provided on the side opposite to the semiconductor substrate with respect to the second active layer, the first active layer may be electrically connected to each of the first contact layer and the semiconductor substrate, and the second active layer may be electrically connected to each of the second contact layer and a third contact layer corresponding to the first contact layer in the dummy region. With this configuration, since the first contact layer and the third contact layer can be formed of the same layer at the time of manufacturing the optical semiconductor element, and the semiconductor substrate can be used as the contact layer on the one side of the first active layer, it is possible to facilitate the manufacturing.

The optical semiconductor element of the present disclosure may further include a first electrode layer provided on a front surface of the first contact layer; a second electrode layer provided on a back surface of the semiconductor substrate; a third electrode layer provided on a front surface of the second contact layer; and a fourth electrode layer provided in a region in which a portion on the second contact layer side relative to the third contact layer is not provided on a front surface of the third contact layer due to the portion being configured as a ridge structure. With this configuration, it is possible to reliably apply a voltage to each of the first active layer and the second active layer while simplifying a structure of the optical semiconductor element.

In the optical semiconductor element of the present disclosure, the first quantum cascade region may be the quantum cascade detector, and the second quantum cascade region may be the quantum cascade laser. With this configuration, the side opposite to the semiconductor substrate with respect to the quantum cascade detector is a space such that it is possible to prevent laser light emitted from the quantum, cascade laser from being reflected by the first laminated structure and returning to the quantum cascade laser.

In the optical semiconductor element of the present disclosure, the semiconductor substrate may be a semi-insulating substrate, the first quantum cascade region may include a first active layer, a first contact layer provided on the side opposite to the semiconductor substrate with respect to the first active layer, and a second contact layer provided on the semiconductor substrate side with respect to the first active layer, the second quantum cascade region may include a second active layer, and a third contact layer provided on the side opposite to the semiconductor substrate with respect to the second active layer, the first active layer may be electrically connected to each of the first contact layer and the second contact layer, and the second active layer may be electrically connected to each of the third contact layer and a fourth contact layer corresponding to the first contact layer in the dummy region. With this configuration, since the first contact layer and the fourth contact layer can be formed of the same layer at the time of manufacturing the optical semiconductor element, it is possible to facilitate the manufacturing.

The optical semiconductor element of the present disclosure may further include a first electrode layer provided on a front surface of the first contact layer; a second electrode layer provided in a region in which a portion on the first contact layer side relative to the second contact layer is not provided on a front surface of the second contact layer due to the portion being configured as a ridge structure, a third electrode layer provided on a front surface of the third contact layer, and a fourth electrode layer provided in a region in which a portion on the third contact layer side relative to the fourth contact layer is not provided on a front surface of the fourth contact layer due to the portion being configured as a ridge structure. With this structure, it is possible to reliably apply a voltage to each of the first active layer and the second active layer while simplifying a structure of the optical semiconductor element.

In the optical semiconductor element of the present disclosure, a light incidence surface of the quantum cascade detector may be a surface inclined with respect to a resonance direction of the quantum cascade laser. With this configuration, it is possible to prevent laser light emitted from the quantum cascade laser from being reflected by the light incidence surface of the quantum cascade detector and returning to the quantum cascade laser.

In the optical semiconductor element of the present disclosure, a light incidence surface of the quantum cascade detector may be shifted in a direction parallel to the front surface of the substrate and perpendicular to a resonance direction of the quantum cascade laser. With this configuration, it is possible to prevent laser light emitted from the quantum cascade laser from being reflected by the light incidence surface of the quantum cascade detector and returning to the quantum cascade laser.

A method of manufacturing an optical semiconductor element of the present disclosure is a method of manufacturing the optical semiconductor element described above and includes a step of forming a laminated structure including the first laminated structure and the second laminated structure on the front surface of the semiconductor substrate; and a step of forming the first laminated structure and the second laminated structure by performing etching on the laminated structure.

According to the method of manufacturing the optical semiconductor element, it is possible to achieve optimization of the characteristics of each of the quantum cascade laser and the quantum cascade detector.

BRIEF DESCRIPTION OF THE DRAWINGS

FIGS. 4A and 4B is a plan view and a cross-sectional view illustrating a method of manufacturing the optical semiconductor element illustrated in FIG. 1.

FIGS. 7A and 7B is a plan view and a cross-sectional view illustrating the method of manufacturing the optical semiconductor element illustrated in FIG. 1.

FIGS. 10A and 10B is a plan view and a cross-sectional view illustrating a method of manufacturing the optical semiconductor element illustrated in FIG. 8.

FIGS. 11A and 11B is a plan view and a cross-sectional view illustrating the method of manufacturing the optical semiconductor element illustrated in FIG. 8.

FIGS. 12A and 12B is a plan view and a cross-sectional view illustrating the method of manufacturing the optical semiconductor element illustrated in FIG. 8.

FIGS. 13A and 13B is a plan view and a cross-sectional view illustrating the method of manufacturing the optical semiconductor element illustrated in FIG. 8.

FIGS. 14A and 14B is a plan view and a cross-sectional view illustrating the method of manufacturing the optical semiconductor element illustrated in FIG. 8.

FIGS. 15A and 15B is a plan view and a cross-sectional view illustrating the method of manufacturing the optical semiconductor element illustrated in FIG. 8.

DETAILED DESCRIPTION

Figure 1:
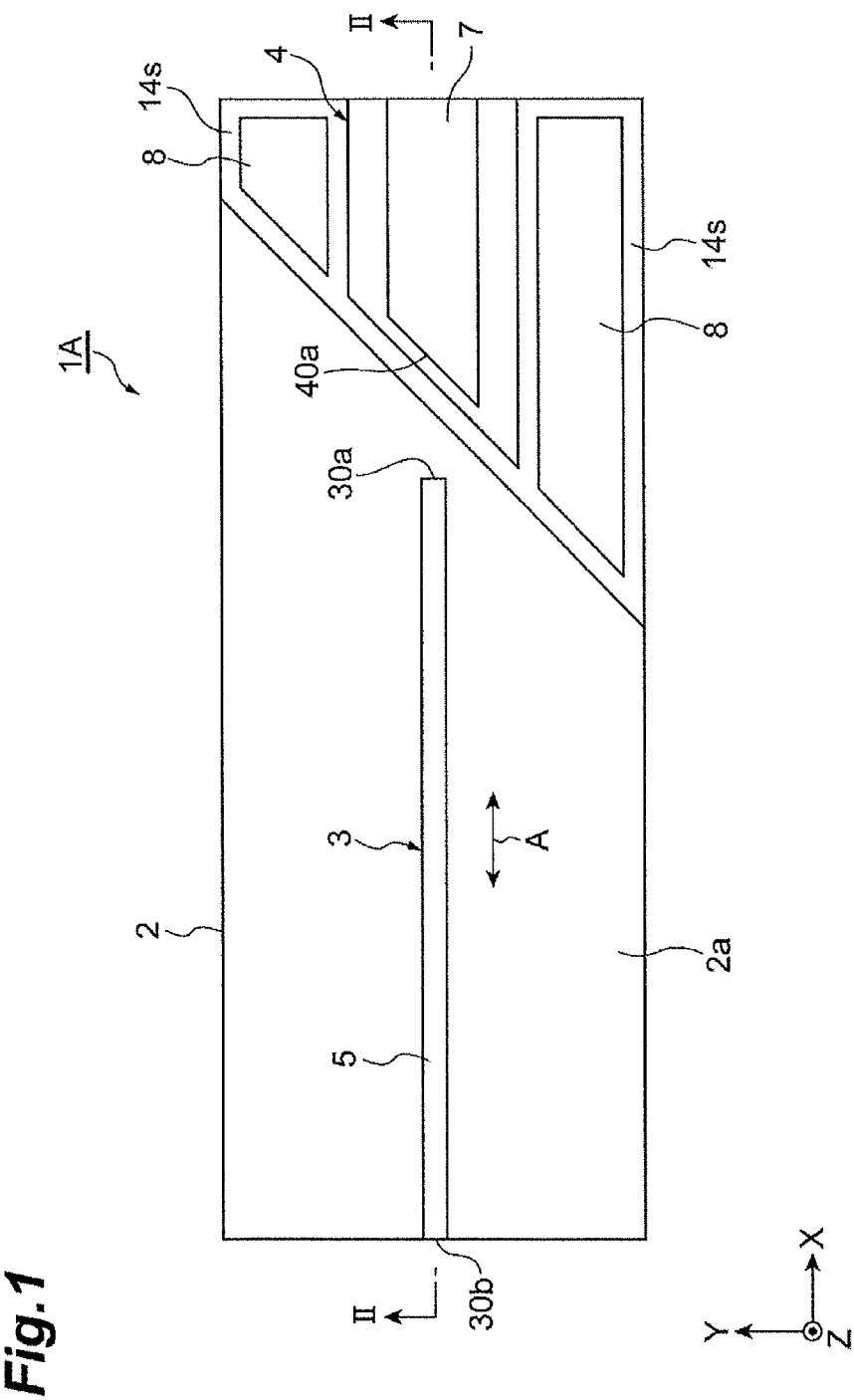
FIG. 1 is a plan view of the optical semiconductor element of a first embodiment.

Hereinafter, embodiments of the present disclosure will be described in detail with reference to the drawings. It should be noted that, in the drawings, the same or corresponding portions are denoted by the same reference numerals and duplicate description will be omitted.

First Embodiment

[Configuration of Optical Semiconductor Element of First Embodiment]

Figure 2:
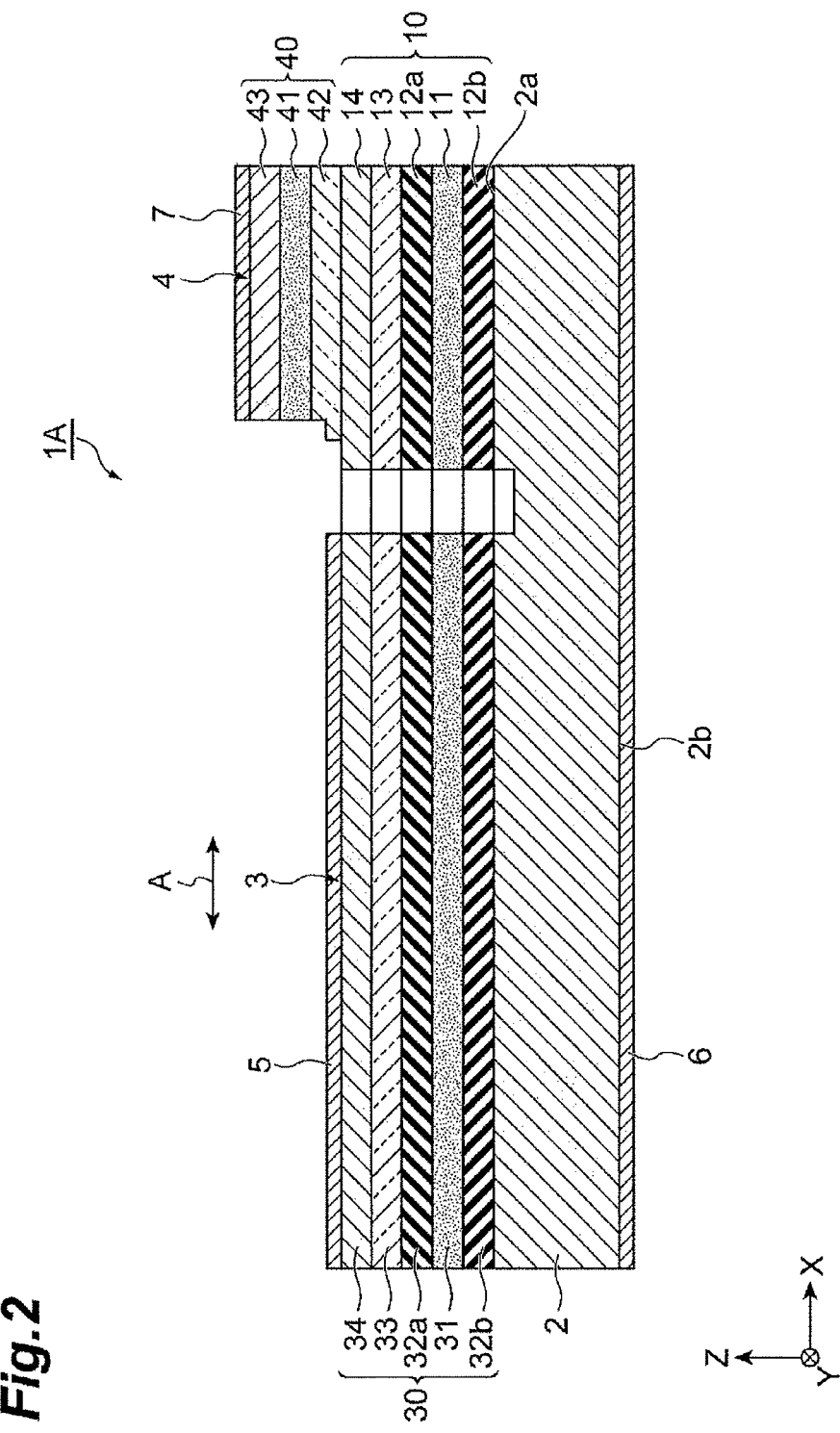
FIG. 2 is a cross-sectional view of the optical semiconductor element taken along a line illustrated in FIG. 1.

As illustrated in FIGS. 1 and 2, an optical semiconductor element 1A includes a semiconductor substrate 2, a first laminated structure 3, and a second laminated structure 4. The semiconductor substrate 2 is an n-type or p-type semiconductor substrate having a front surface 2a that is a main surface on one side and a back surface 2b that is a main surface on the other side. The semiconductor substrate 2 is, for example, an n-type InP single crystal substrate having a rectangular plate shape. A length, width, and thickness of the semiconductor substrate 2 are about hundreds of μm to several mm, about hundreds of μm to several mm, and about hundreds of μm, respectively. In the following description, a length direction, a width direction, and a thickness direction of the semiconductor substrate 2 are referred to as an X-axis direction, a Y-axis direction, and a Z-axis direction, respectively.

The first laminated structure 3 is provided on the front surface 2a of the semiconductor substrate 2. The first laminated structure 3 includes a quantum cascade laser (a first quantum cascade region) 30. The quantum cascade laser 30 is provided on the front surface 2a of the semiconductor substrate 2. A side opposite to the semiconductor substrate 2 with respect to the quantum cascade laser 30 is a space.

The quantum cascade laser 30 includes an active layer (a first active layer) 31, an upper guide layer 32a, a lower guide layer 32b, an upper cladding layer 33, and a contact layer (a contact layer provided on the side opposite to the substrate with respect to the first active layer) 34. The lower guide layer 32b is, for example, an InGaAs layer (Si doped: $5\times10^{16}$/cm$^3$) having a thickness of about 250 nm and is provided on the front surface 2a of the semiconductor substrate 2. The active layer 31 is formed as a quantum cascade structure and is provided on a front surface of the lower guide layer 32b. The upper guide layer 32a is, for example, an InGaAs layer (Si doped: $5\times10^{16}$/cm$^3$) having a thickness of about 250 nm and is provided on a front surface of the active layer 31. The upper cladding layer 33 is, for example, an InP layer (Si doped: $1\times10^{17}$/cm$^3$) having a thickness of about 3.5 μm and is provided on a front surface of the upper guide layer 32a. The contact layer 34 is, for example, an InGaAs layer (Si doped: $2\times10^{18}$/cm$^3$) having a thickness of about 250 nm and is provided on a front surface of the upper cladding layer 33.

The quantum cascade laser 30 is configured as a ridge stripe structure. The quantum cascade laser 30 includes a light emitting surface 30a and a reflective surface 30b that are both end surfaces in the X-axis direction. The light emitting surface 30a and the reflective surface 30b are surfaces perpendicular to the X-axis direction. A length of the quantum cascade laser 30 in the X-axis direction is, for example, hundreds of μm to several mm. A width of the quantum cascade laser 30 in the Y-axis direction is, for example, several μm to tens of μm. It should be noted that the length of the quantum cascade laser 30 in the X-axis direction corresponds to a resonator length of the quantum cascade laser 30 (a distance between the light emitting surface 30a and the reflective surface 30b). In the quantum cascade laser 30, the X-axis direction corresponds to a resonance direction A.

The active layer 31 is electrically connected to the contact layer 34 and the semiconductor substrate 2. An example of the quantum cascade structure per cycle in the active layer 31 (when a design value of an oscillation wavelength of the quantum cascade laser 30 is 5.56 μm) is as illustrated in Table 1. In this case, the active layer 31 is configured by the quantum cascade structure corresponding to 33 cycles.

TABLE 1

| | Semiconductor layer | Composition | Film thickness(nm) | Doping |
|---|---|---|---|---|
| Light emitting region | Barrier layer 1 | InAlAs | 3.6 | Undoped |
| | Well layer 1 | InGaAs | 1.2 | Undoped |
| | Barrier layer 2 | InAlAs | 0.9 | Undoped |
| | Well layer 2 | InGaAs | 4.8 | Undoped |

TABLE 1-continued

| | Semiconductor layer | Composition | Film thickness(nm) | Doping |
|---|---|---|---|---|
| | Barrier layer 3 | InAlAs | 1.1 | Undoped |
| | Well layer 3 | InGaAs | 4.2 | Undoped |
| | Barrier layer 4 | InAlAs | 1.5 | Undoped |
| | Well layer 4 | InGaAs | 3.8 | Undoped |
| | Barrier layer 5 | InAlAs | 1.9 | Undoped |
| Injection region | Well layer 5 | InGaAs | 3.1 | Undoped |
| | Barrier layer 6 | InAlAs | 1.7 | Undoped |
| | Well layer 6 | InGaAs | 2.9 | Undoped |
| | Barrier layer 7 | InAlAs | 2.0 | Undoped |
| | Well layer 7 | InGaAs | 2.5 | Undoped |
| | Barrier layer 8 | InAlAs | 2.2 | Si doped $1.8 \times 10^{17}$ cm$^{-3}$ |
| | Well layer 8 | InGaAs | 2.3 | Si doped $1.8 \times 10^{17}$ cm$^{-3}$ |
| | Barrier layer 9 | InAlAs | 2.6 | Si doped $1.8 \times 10^{17}$ cm$^{-3}$ |
| | Well layer 9 | InGaAs | 2.2 | Si doped $1.8 \times 10^{17}$ cm$^{-3}$ |
| | Barrier layer 10 | InAlAs | 3.2 | Undoped |
| | Well layer 10 | InGaAs | 2.0 | Undoped |

The second laminated structure 4 is provided on the front surface 2a of the semiconductor substrate 2 so that one end of the second laminated structure 4 faces the ridge structure of the first laminated structure 3 in a direction in which the ridge structure of the first laminated structure 3 extends. The second laminated structure 4 includes a dummy region 10 and a quantum cascade detector (a second quantum cascade region) 40. The dummy region 10 is provided on the front surface 2a of the semiconductor substrate 2. The quantum cascade detector 40 is provided on the front surface 2a of the semiconductor substrate 2 via the dummy region 10.

The dummy region 10 has the same layer structure as the quantum cascade laser 30 of the first laminated structure 3. That is, the dummy region 10 has an active layer 11, an upper guide layer 12a, a lower guide layer 12b, an upper cladding layer 13, and a contact layer (a third contact layer corresponding to a first contact layer in the dummy region) 14. The active layer 11, the upper guide layer 12a, the lower guide layer 12b, the upper cladding layer 13, and the contact layer 14 correspond to the active layer 31, the upper guide layer 32a, the lower guide layer 32b, the upper cladding layer 33, and the contact layer 34, respectively.

The quantum cascade detector 40 includes an active layer (a second active layer) 41, a lower cladding layer 42, and a contact layer (a second contact layer provided on a side opposite to the substrate with respect to the second active layer) 43. The lower cladding layer 42 is, for example, an InP layer (Si doped: $1\times10^{17}$/cm$^3$) having a thickness of about 2 μm and is provided on a front surface of the contact layer 14 in the dummy region 10. The active layer 41 is configured as a quantum cascade structure and is provided on a front surface of the lower cladding layer 42. The contact layer 43 is, for example, an InGaAs layer (Si doped: $5\times10^{18}$/cm$^3$) having a thickness of about 20 nm and is provided on a front surface of the active layer 41.

The quantum cascade detector 40 is configured as a ridge structure. Specifically, a portion on the contact layer 43 side relative to the contact layer 14 in the dummy region 10 is configured as a ridge structure. A region (a region of the front surface of the third contact layer in which the portion is not provided) 14s extends on both sides of the portion in the Y-axis direction on the front surface of the contact layer 14. The quantum cascade detector 40 includes a light incidence surface 40a which is an end surface on the quantum cascade laser 30 side in the X-axis direction. The light incidence surface 40a is a surface inclined with respect to the resonance direction A of the quantum cascade laser 30. For example, the light incidence surface 40a is a surface inclined to be parallel to the Z-axis direction and intersect the X-axis direction and the Y-axis direction. A length of the quantum cascade detector 40 in the X-axis direction is, for example, hundreds of μm to several mm, and a width of the quantum cascade detector 40 in the Y-axis direction is, for example, several μm to tens of μm. It should be noted that it is possible to increase light reception efficiency of the laser light emitted from the quantum cascade laser 30 by making the width of the quantum cascade detector 40 in the Y-axis direction larger than the width of the quantum cascade laser 30 in the Y-axis direction.

The active layer 41 is electrically connected to each of the contact layers 43 and 14. An example of the quantum cascade structure per cycle in the active layer 41 (when a design value of a sensitivity wavelength of the quantum cascade detector 40 is 5.21 to 5.66 μm) is as illustrated in Table 2. In this case, the active layer 41 is configured by the quantum cascade structure corresponding to 30 cycles.

TABLE 2

| Semiconductor layer | | Composition | Film thickness (nm) | Doping |
|---|---|---|---|---|
| Light reception region | Barrier layer 1 | InAlAs | 3.5 | Undoped |
| | Well layer 1 | InGaAs | 5.0 | Si doped $4 \times 10^{17}$ cm$^{-3}$ |
| | Barrier layer 2 | InAlAs | 1.0 | Undoped |
| | Well layer 2 | InGaAs | 1.2 | Undoped |
| Pull-out region | Barrier layer 3 | InAlAs | 4.1 | Undoped |
| | Well layer 3 | InGaAs | 1.7 | Undoped |
| | Barrier layer 4 | InAlAs | 3.1 | Undoped |
| | Well layer 4 | InGaAs | 2.0 | Undoped |
| | Barrier layer 5 | InAlAs | 2.7 | Undoped |
| | Well layer 5 | InGaAs | 2.4 | Undoped |
| | Barrier layer 6 | InAlAs | 2.4 | Undoped |
| | Well layer 6 | InGaAs | 2.7 | Undoped |
| | Barrier layer 7 | InAlAs | 2.4 | Undoped |
| | Well layer 7 | InGaAs | 3.3 | Undoped |
| | Barrier layer 8 | InAlAs | 3.0 | Undoped |
| | Well layer 8 | InGaAs | 4.0 | Undoped |

An electrode layer (a first electrode layer) 5 is provided on a front surface of the contact layer 34 of the quantum cascade laser 30. An electrode layer (a second electrode layer) 6 is provided on the back surface 2b of the semiconductor substrate 2. An electrode layer (a third electrode layer) 7 is provided on a front surface of the contact layer 43 of the quantum cascade detector 40. An electrode layer (a fourth electrode layer) 8 is provided in the region 14s on the front surface of the contact layer 14 in the dummy region 10. In the optical semiconductor element 1A, a pair of electrode layers 8 are provided on both sides of a portion on the contact layer 43 side relative to the contact layer 14. Each of the electrode layers 5, 6, 7, and 8 is, for example, a Ti film having a thickness of about 50 nm or an Au film having a thickness of about 300 nm. It should be noted that the first laminated structure 3 and the second laminated structure 4 are covered with an insulating layer (not illustrated), and the respective electrode layers 5, 7, and 8 are electrically connected to the surfaces of the respective contact layers 34, 43, and 14 via openings formed in the insulating layer. The insulating layer is, for example, a SiN film having a thickness of about 300 nm.

The optical semiconductor element 1A configured as described above is used, for example, in a state in which the optical semiconductor element 1A is mounted on a wiring board as follows. That is, in a state in which the optical semiconductor element 1A is exposed to a gas atmosphere that is an analysis target, a bias voltage is applied to the quantum cascade laser 30 through the electrode layers 5 and 6, and laser oscillation is caused in the quantum cascade laser 30. Accordingly, laser light emitted from the light emitting surface 30a of the quantum cascade laser 30 is incident on the light incidence surface 40a of the quantum cascade detector 40 through the gas that is an analysis target, and an electrical signal is output from the quantum cascade detector 40 through the electrode layers 7 and 8. In this case, since the dummy region 10 is electrically isolated, the dummy region 10 functions neither as a quantum cascade laser nor as a quantum cascade detector. The electrical signal output from the quantum cascade detector 40 is input to a processing circuit at a subsequent stage. In the processing circuit at the subsequent stage, a composition of the gas that is an analysis target is analyzed on the basis of the electrical signal. Although both of the end surfaces of the quantum cascade laser 30 have been described above as the light emitting surface 30a and the reflective surface 30b for convenience, light is actually output from both of the end surfaces of the quantum cascade laser 30. A diffraction grating is disposed in an emission direction of the end surface of the quantum cascade laser 30 serving as the reflective surface 30b such that an external resonator can be configured between the end surface and the diffraction grating. Such an external resonator is configured such that the emitted light of the quantum cascade laser 30 can be narrowed. Furthermore, a wavelength can also be selected by controlling an angle of the diffraction grating with respect to the laser light. Further, when the end surface of the quantum cascade laser 30 serving as the reflective surface 30b is used as the light emitting surface, the light output from the end surface is used as probe light for spectral analysis and the light output from the end surface of the quantum cascade laser 30 serving as the light emitting surface 30a is detected by the quantum cascade detector 40 such that the quantum cascade detector 40 can be used as a back monitor for the probe light for the spectral analysis.

Figure 3:
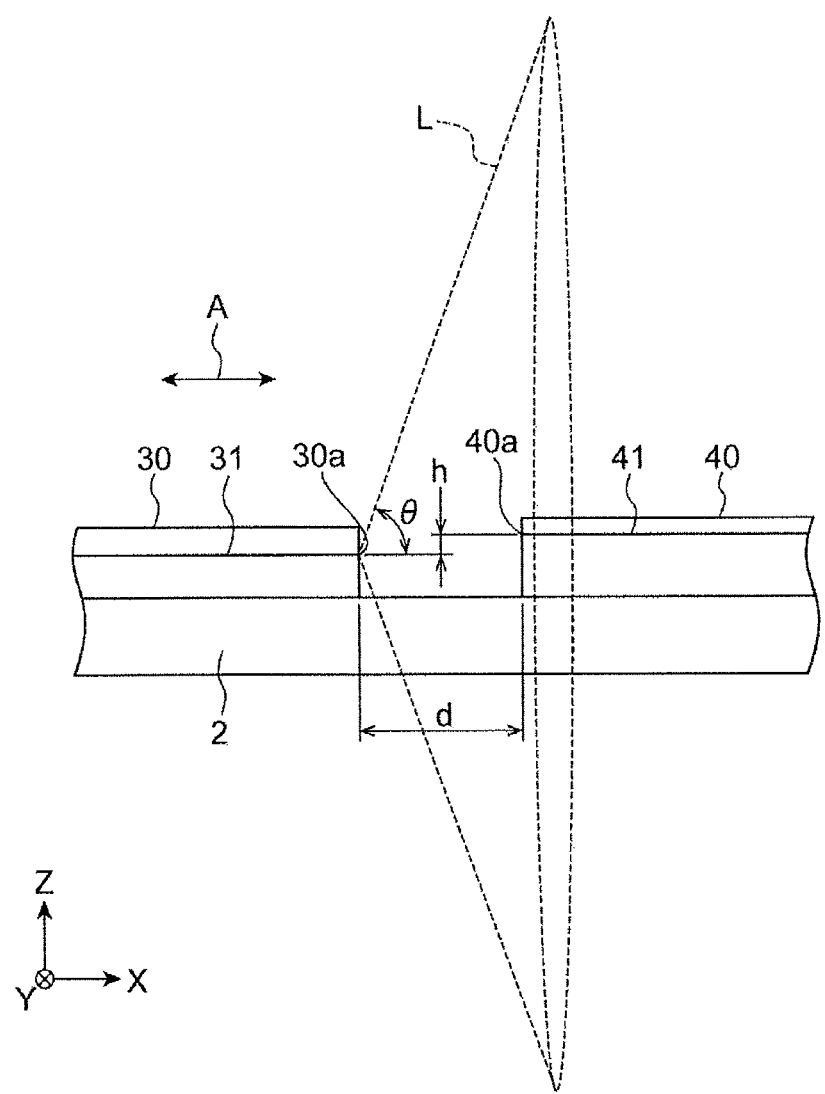
FIG. 3 is a schematic diagram illustrating a positional relationship between an active layer of a quantum cascade laser and an active layer of a quantum cascade detector.

It should be noted that, as illustrated in FIG. 3, when a design value of the oscillation wavelength of the quantum cascade laser 30 is 5.56 μm, a one-side radiation angle θ of the laser light L emitted from the light emitting surface 30a of the quantum cascade laser 30 is 70° or more. On the other hand, when a distance d between the light emitting surface 30a of the quantum cascade laser 30 and the light incidence surface 40a of the quantum cascade detector 40 in the X-axis direction is 125 µm, and a height difference h between the active layer 31 of the quantum cascade laser 30 and the active layer 41 of the quantum cascade detector 40 is 6 µm, a slope angle tan (h/d) between the active layer 31 and the active layer 41 is about 3°. Therefore, the laser light L emitted from the light emitting surface 30a of the quantum cascade laser 30 can be sufficiently incident on the light incidence surface 40a of the quantum cascade detector 40.

[Method of Manufacturing Optical Semiconductor Element of First Embodiment]

As illustrated in FIGS. 4A and 4B, a step of forming a laminated structure 100 including a first laminated structure 3 and a second laminated structure 4 on a front surface 2a of a semiconductor substrate 2 is performed. More specifically, a lower guide layer 101, an active layer 102, an upper guide layer 103, an upper cladding layer 104, a contact layer 105, a lower cladding layer 106, an active layer 107, and a contact layer 108 are epitaxially grown sequentially on the front surface 2a of the semiconductor substrate 2 using a molecular beam epitaxy method, an organometallic vapor growth method, or the like so that a laminated structure 100 is formed on the front surface 2a of the semiconductor substrate 2.

The lower guide layer 101 is a layer including the lower guide layers 32b and 12b. The active layer 102 is a layer including the active layers 31 and 11. The upper guide layer 103 is a layer including the upper guide layers 32a and 12a. The upper cladding layer 104 is a layer including the upper cladding layers 33 and 13. The contact layer 105 is a layer including the contact layers 34 and 14. The lower cladding layer 106 is a layer including the lower cladding layer 42. The active layer 107 is a layer including the active layer 41. The contact layer 108 is a layer including the contact layer 43.

Figure 5A:
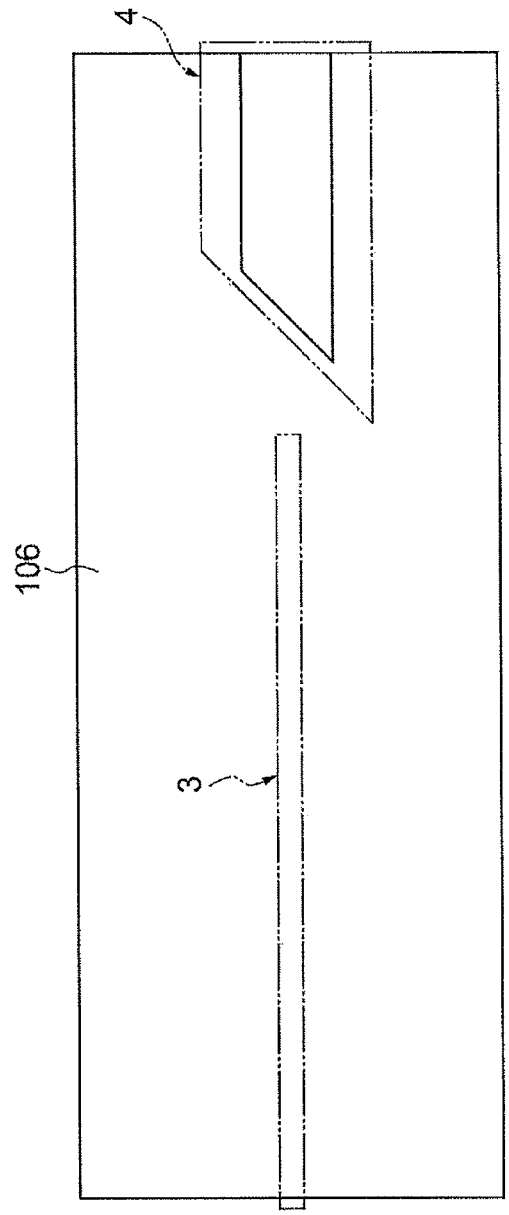
FIGS. 5A and 5B is a plan view and a cross-sectional view illustrating the method of manufacturing the optical semiconductor element illustrated in FIG. 1.
Figure 5B:
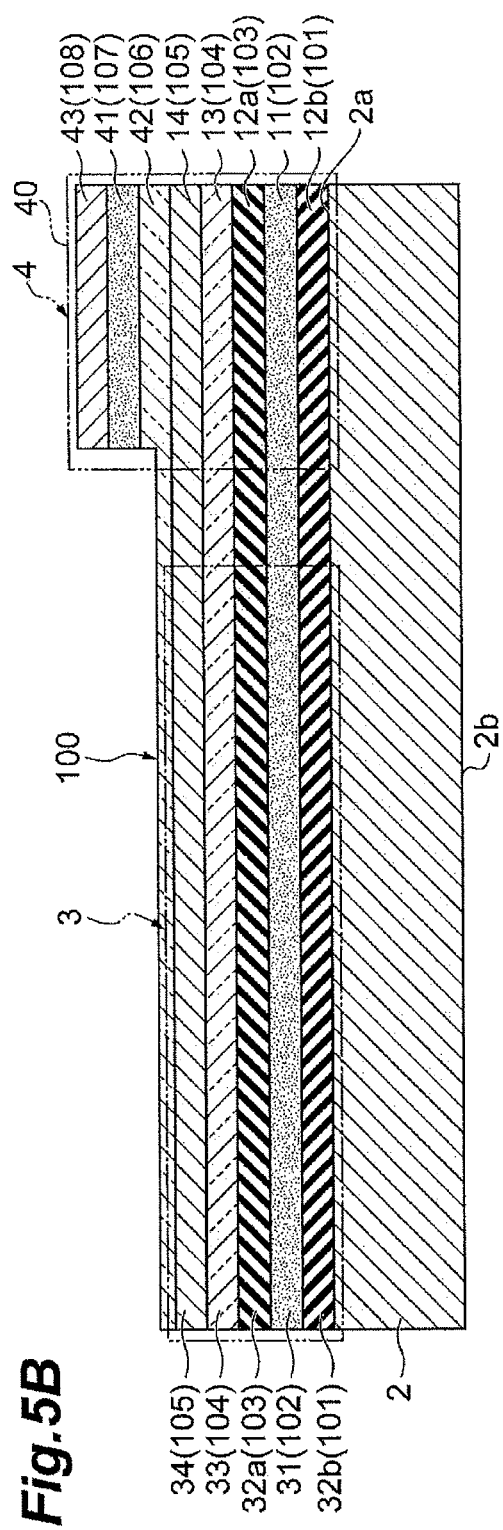
Figure 6A:
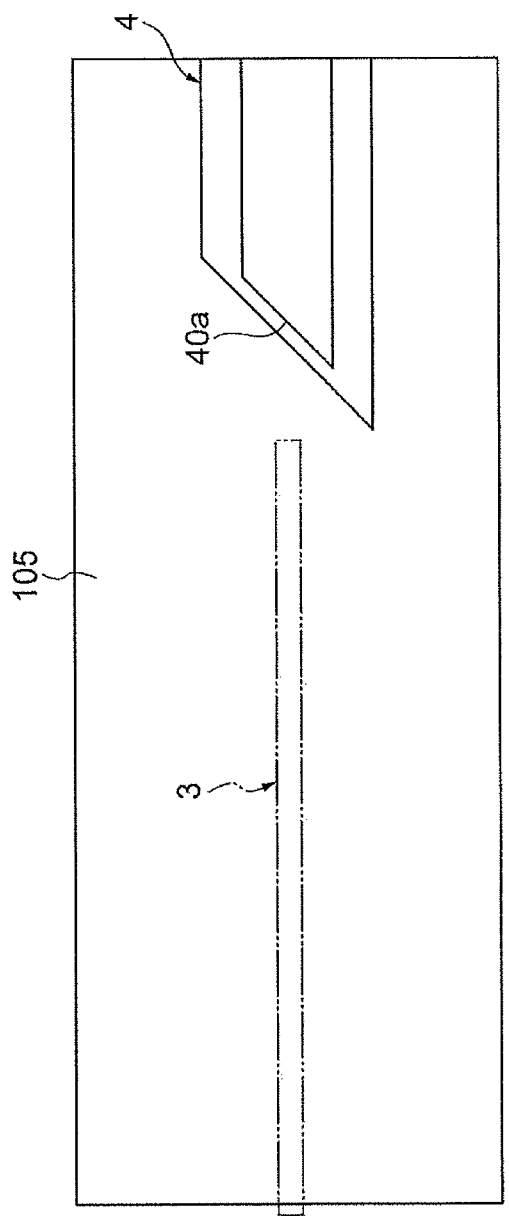
FIGS. 6A and 6B is a plan view and a cross-sectional view illustrating the method of manufacturing the optical semiconductor element illustrated in FIG. 1.
Figure 6B:
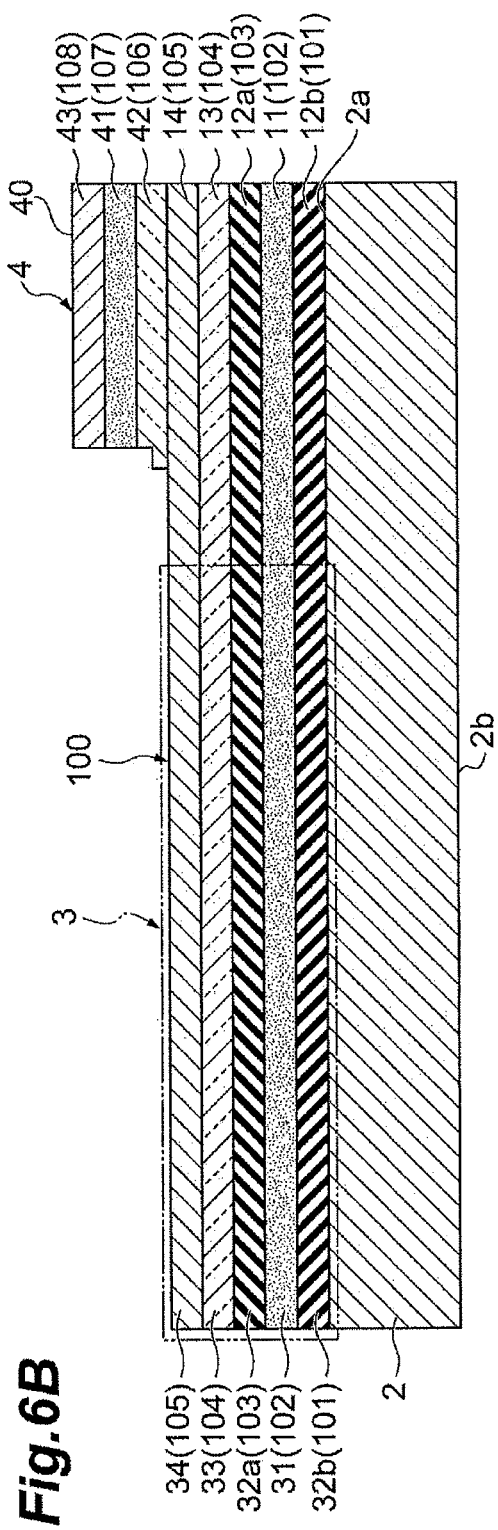

A step of forming the first laminated structure 3 and the second laminated structure 4 by etching the laminated structure 100 is performed following the step of forming the laminated structure 100. More specifically, as illustrated in FIGS. 5A and 5B, portions on the front surface sides of the contact layer 108, the active layer 107, and the lower cladding layer 106 are selectively removed by etching so that a part of the quantum cascade detector 40 of the second laminated structure 4 is formed. Subsequently, as illustrated in FIGS. 6A and 6B, a portion on the back surface side of the lower cladding layer 106 is selectively removed by etching using the contact layer 105 as an etching stop layer so that the front surface of the contact layer 105 is exposed and the quantum cascade detector 40 is formed. Subsequently, as illustrated in FIGS. 7A and 7B, the contact layer 105, the upper cladding layer 104, the upper guide layer 103, the active layer 102, and the lower guide layer 101 are selectively removed by etching so that the quantum cascade laser 30 is formed.

Following the step of forming the first laminated structure 3 and the second laminated structure 4, the semiconductor substrate 2 is thinned by removing the portion on the back surface 2b side of the semiconductor substrate 2 as necessary, and an insulating layer is formed to cover the first laminated structure 3 and the second laminated structure 4. Subsequently, the respective electrode layers 5, 7, and 8 are formed on the front surfaces of the respective contact layers 34, 43, and 14 by vapor deposition or the like through openings formed in the insulating layer, and the electrode layer 6 is formed on the back surface 2b of the semiconductor substrate 2 by vapor deposition or the like. It should be noted that highly reflective coating may be applied on the reflective surface 30b of the quantum cascade laser 30 and on an end surface of the quantum cascade detector 40 opposite to the light incidence surface 40a. By applying the highly reflective coating on the reflective surface 30b of the quantum cascade laser 30, a mirror loss in the quantum cascade laser 30 can be reduced, internal resonance can be facilitated, and high output can be achieved. In addition, by applying the highly reflective coating on the end surface of the quantum cascade detector 40 opposite to the light incidence surface 40a, light can be confined in the quantum cascade detector 40 and more signals can be detected. Low reflective coating may be applied on the reflective surface 30b of the quantum cascade laser 30. In this case, when an external resonator is configured by disposing a diffraction grating or a reflective mirror at a position facing the reflective surface 30b of the quantum cascade laser 30, reflected light from the diffraction grating or the reflective mirror can be efficiently incident on the active layer of the quantum cascade laser 30. When the diffraction grating is disposed, an arbitrary wavelength can be output by controlling an angle of the diffraction grating with respect to output light.

The optical semiconductor element 1A is obtained by performing each of the above steps. It should be noted that it is possible to perform the above steps at a wafer level and to finally dice the wafer, thereby obtaining a plurality of optical semiconductor elements 1A.

[Operation and Effects of First Embodiment]

In the optical semiconductor element 1A, in the second laminated structure 4, the quantum cascade detector 40 is provided on the front surface 2a of the semiconductor substrate 2 through the dummy region 10 having the same layer structure as the quantum cascade laser 30. That is, the quantum cascade laser 30 included in the first laminated structure 3 and the quantum cascade detector 40 included in the second laminated structure 4 are located at different heights from the front surface 2a of the semiconductor substrate 2. Therefore, it is possible to achieve optimization of characteristics of the quantum cascade laser 30 and the quantum cascade detector 40. Further, it becomes easy to match the oscillation wavelength of the quantum cascade laser 30 with the sensitivity wavelength of the quantum cascade detector 40. Furthermore, a degree of freedom of design of each of the quantum cascade laser 30 and the quantum cascade detector 40 is increased.

Further, in the optical semiconductor element 1A, the quantum cascade laser 30 is disposed on the front surface 2a of the semiconductor substrate 2. Thus, it is possible to enhance heat radiation of the quantum cascade laser 30 via the semiconductor substrate 2.

Further, in the optical semiconductor element 1A, the active layer 31 of the quantum cascade laser 30 is electrically connected to each of the contact layer 34 and the semiconductor substrate 2. The active layer 41 of the quantum cascade detector 40 is electrically connected to the contact layer 43 and the contact layer 14 corresponding to the contact layer 34 in the dummy region 10. Accordingly, since the contact layer 34 of the first laminated structure 3 and the contact layer 14 of the second laminated structure 4 can be formed of the same layer at the time of manufacturing the optical semiconductor element 1A, and the semiconductor substrate 2 can be used as the contact layer on the one side of the active layer 31 of the quantum cascade laser 30, it is possible to facilitate the manufacturing.

Further, in the optical semiconductor element 1A, the electrode layer 5 is provided on the front surface of the contact layer 34, the electrode layer 6 is provided on the back surface 2b of the semiconductor substrate 2, the electrode layer 7 is provided on the front surface of the contact layer 43, and the electrode layer 8 is provided in the region 14s, in which a portion configured as the ridge structure is not provided on the front surface of the contact layer 14. Thus, it is possible to reliably apply a voltage to each of the active layers 31 and 41 while simplifying a structure of the optical semiconductor element 1A.

Further, in the optical semiconductor element 1A, the light incidence surface 40a of the quantum cascade detector 40 is a surface inclined with respect to the resonance direction A of the quantum cascade laser 30. Thus, it is possible to prevent the laser light emitted from the quantum cascade laser 30 from being reflected by the light incidence surface 40a of the quantum cascade detector 40 and returning to the quantum cascade laser 30.

Further, in the method of manufacturing the optical semiconductor element 1A, the laminated structure 100 including the first laminated structure 3 and the second laminated structure 4 is formed on the front surface 2a of the semiconductor substrate 2, and the laminated structure 100 is etched to form the first laminated structure 3 and the second laminated structure 4. Accordingly, it is possible to achieve optimization of characteristics of each of the quantum cascade laser 30 and the quantum cascade detectors 40. Further, since monolithic fabrication is possible through a semiconductor manufacturing process, it is possible to obtain the optical semiconductor element 1A in which positional accuracy of the quantum cascade laser 30 and the quantum cascade detector 40 is very high.

Second Embodiment

[Configuration of Optical Semiconductor Element of Second Embodiment]

Figure 8:
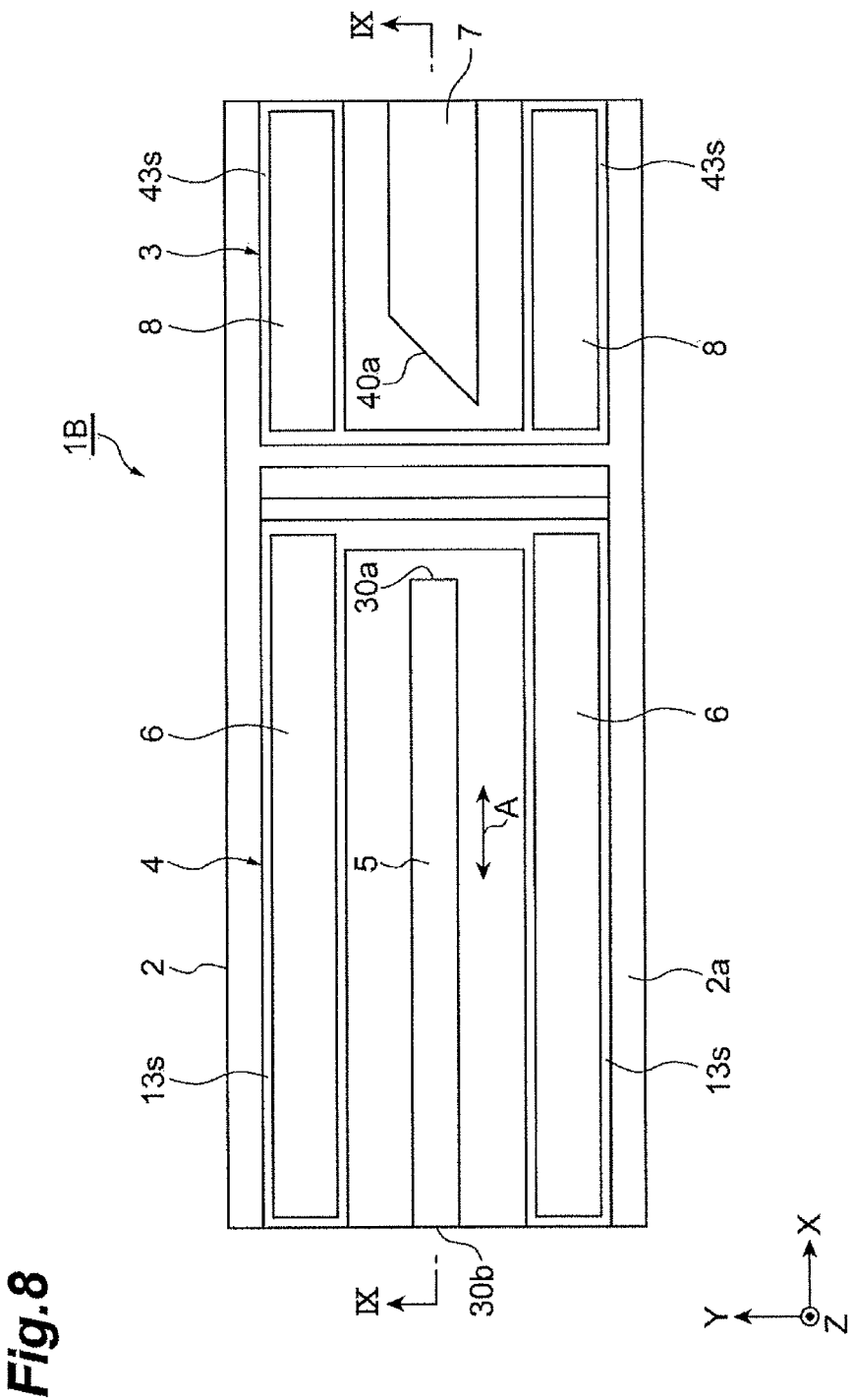
FIG. 8 is a plan view of an optical semiconductor element of a second embodiment.
Figure 9:
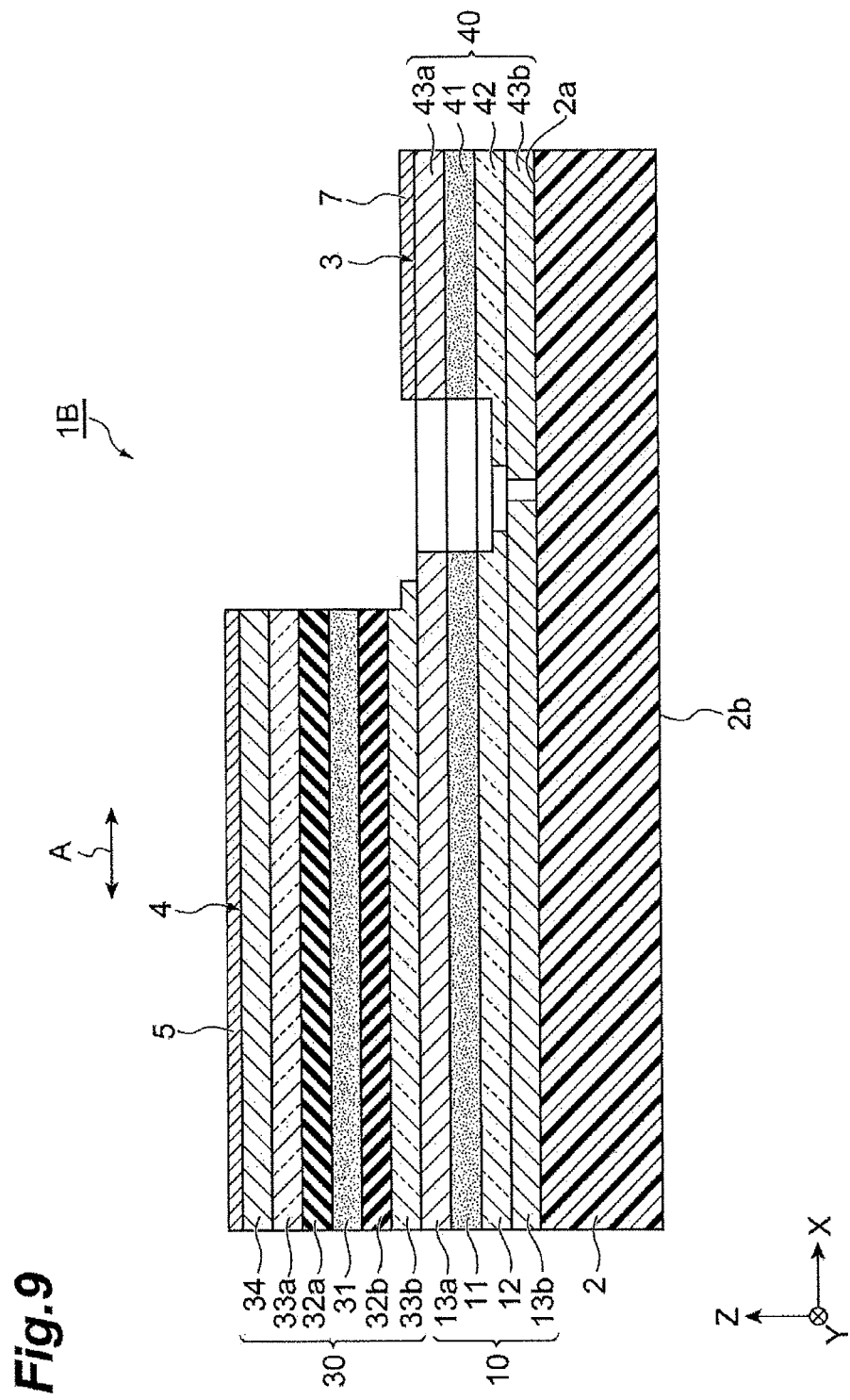
FIG. 9 is a cross-sectional view of the optical semiconductor element taken along a line IX-IX illustrated in FIG. 8.

As illustrated in FIGS. 8 and 9, an optical semiconductor element 1B is different from the optical semiconductor element 1A described above in that a first laminated structure 3 includes a quantum cascade detector (a first quantum cascade region) 40, and a second laminated structure 4 includes a dummy region 10 and a quantum cascade laser (a second quantum cascade region) 30. In the optical semiconductor element 1B, the semiconductor substrate 2 is a semi-insulating substrate (a high-resistance semiconductor substrate in which impurities are not doped). The semiconductor substrate 2 is, for example, an InP single crystal substrate having a rectangular plate shape.

In the optical semiconductor element 1B, the first laminated structure 3 includes a quantum cascade detector 40. The quantum cascade detector 40 is provided on a front surface 2a of the semiconductor substrate 2. A side opposite to the semiconductor substrate 2 with respect to the quantum cascade detector 40 is a space.

The quantum cascade detector 40 includes an active layer (a first active layer) 41, a lower cladding layer 42, a contact layer (a first contact layer provided on the side opposite to the substrate with respect to the first active layer) 43a, and a contact layer (a second contact layer provided on the substrate side with respect to the first active layer) 43b. The contact layer 43b is, for example, an InGaAs layer (Si doped: $2\times10^{18}/cm^3$) having a thickness of about 200 nm and is provided on the front surface 2a of the semiconductor substrate 2. The lower cladding layer 42 is, for example, an InP layer (Si doped: $1\times10^{17}/cm^3$) having a thickness of about 2 μm and is provided on a front surface of the contact layer 43b. The active layer 41 is configured as a quantum cascade structure and is provided on a front surface of the lower cladding layer 42. The contact layer 43a is, for example, an InGaAs layer (Si doped: $2\times10^{18}/cm^3$) having a thickness of about 250 nm and is provided on a front surface of the active layer 41.

The quantum cascade detector 40 is configured as a ridge structure. Specifically, a portion on the contact layer 43a side relative to the contact layer 43b is configured as a ridge structure. A region (a region in which the portion is not provided on the front surface of the second contact layer) 43s extends on both sides of the portion in the Y-axis direction on the front surface of the contact layer 43b. The quantum cascade detector 40 includes a light incidence surface 40a which is an end surface on the quantum cascade laser 30 side in the X-axis direction. The light incidence surface 40a is a surface inclined with respect to the resonance direction A of the quantum cascade laser 30. For example, the light incidence surface 40a is a surface inclined to be parallel to the Z-axis direction and intersect the X-axis direction and the Y-axis direction. A length of the quantum cascade detector 40 in the X-axis direction is, for example, hundreds of μm to several mm, and a width of the quantum cascade detector 40 in the Y-axis direction is, for example, several μm to tens of μm. It should be noted that it is possible to increase light reception efficiency of the laser light emitted from the quantum cascade laser 30 by making the width of the quantum cascade detector 40 in the Y-axis direction larger than the width of the quantum cascade laser 30 in the Y-axis direction.

The active layer 41 is electrically connected to each of the contact layers 43a and 43b. An example of the quantum cascade structure per cycle in the active layer 41 (when a design value of a sensitivity wavelength of the quantum cascade detector 40 is 5.21 to 5.66 μm) is as illustrated in Table 2. In this case, the active layer 41 is configured by the quantum cascade structure corresponding to 30 cycles.

In the optical semiconductor element 1B, the second laminated structure 4 includes the dummy region 10 and the quantum cascade laser 30. The dummy region 10 is provided on the front surface 2a of the semiconductor substrate 2. The quantum cascade laser 30 is provided on the front surface 2a of the semiconductor substrate 2 via the dummy region 10 to face the ridge structure of the first laminated structure 3 in a direction in which the ridge structure of the first laminated structure 3 extends.

The dummy region 10 has the same layer structure as the quantum cascade detector 40 of the first laminated structure 3. That is, the dummy region 10 includes an active layer 11, a lower cladding layer 12, a contact layer (a fourth contact layer corresponding to the first contact layer in the dummy region) 13a, and a contact layer 13b. The active layer 11, the lower cladding layer 12, the contact layer 13a, and the contact layer 13b correspond to the active layer 41, the lower cladding layer 42, the contact layer 43a, and the contact layer 43b, respectively.

The quantum cascade laser 30 includes an active layer (a second active layer) 31, an upper guide layer 32a, a lower guide layer 32b, an upper cladding layer 33a, a lower cladding layer 33b, and a contact layer (a third contact layer provided on a side opposite to the substrate with respect to the second active layer) 34. The lower cladding layer 33b is, for example, an InP layer (Si doped: $1\times10^{17}/cm^3$) having a thickness of about 3.5 μm and is provided on a front surface of the contact layer 13a of the dummy region 10. The lower guide layer 32b is, for example, an InGaAs layer (Si doped: $5\times10^{16}/cm^3$) having a thickness of about 250 nm and is provided on the front surface of the lower cladding layer 33b. The active layer 31 is configured as a quantum cascade structure and is provided on a front surface of the lower guide layer 32b. The upper guide layer 32a is, for example, an InGaAs layer (Si doped: $5 \times 10^{16}/cm^3$) having a thickness of about 250 nm and is provided on the front surface of the active layer 31. The upper cladding layer 33a is, for example, an InP layer (Si doped: $1 \times 10^{17}/cm^3$) having a thickness of about 3.5 μm and is provided on a front surface of the upper guide layer 32a. The contact layer 34 is, for example, an InGaAs layer (Si doped: $5 \times 10^{18}/cm^3$) having a thickness of about 20 nm and is provided on a front surface of the upper cladding layer 33a.

The quantum cascade laser 30 is configured as a ridge stripe structure. Specifically, a portion on the contact layer 34 side relative to the contact layer 13a is configured as a ridge structure. A region (a region in which the portion is not provided on the front surface of the fourth contact layer) 13s extends on both sides of the portion in the Y-axis direction on the front surface of the contact layer 13a. The quantum cascade laser 30 includes a light emitting surface 30a and a reflective surface 30b that are both end surfaces in the X-axis direction. The light emitting surface 30a and the reflective surface 30b are surfaces perpendicular to the X-axis direction. A length of the quantum cascade laser 30 in the X-axis direction is, for example, hundreds of μm to several mm A width of the quantum cascade laser 30 in the Y-axis direction is, for example, several μm to tens of μm. It should be noted that the length of the quantum cascade laser 30 in the X-axis direction corresponds to a resonator length of the quantum cascade laser 30 (a distance between the light emitting surface 30a and the reflective surface 30b). In the quantum cascade laser 30, the X-axis direction corresponds to a resonance direction A.

The active layer 31 is electrically connected to each of the contact layers 34 and 13a. An example of the quantum cascade structure per cycle in the active layer 31 (when a design value of an oscillation wavelength of the quantum cascade laser 30 is 5.56 μm) is as illustrated in Table 1. In this case, the active layer 31 is configured by the quantum cascade structure corresponding to 33 cycles.

An electrode layer (a third electrode layer) 5 is provided on a front surface of the contact layer 34 of the quantum cascade laser 30. An electrode layer (a fourth electrode layer) 6 is provided in a region 13s on the front surface of the contact layer 13a in the dummy region 10. An electrode layer (a first electrode layer) 7 is provided on a front surface of the contact layer 43a of the quantum cascade detector 40. An electrode layer (a second electrode layer) 8 is provided in a region 43s on the front surface of the contact layer 43b of the quantum cascade detector 40. In the optical semiconductor element 1B, a pair of electrode layers 6 are provided on both sides of a portion on the contact layer 34 side relative to the contact layer 13a, and a pair of electrode layers 8 are provided on both sides of a portion on the contact layer 43a side relative to the contact layer 43b. Each of the electrode layers 5, 6, 7, and 8 is, for example, a Ti film having a thickness of about 50 nm or an Au film having a thickness of about 300 nm. It should be noted that the first laminated structure 3 and the second laminated structure 4 are covered with an insulating layer. (not illustrated), and the respective electrode layers 5, 6, 7, and 8 are electrically connected to the surfaces of the respective contact layers 34, 13a, 43a, and 43b via openings formed in the insulating layer. The insulating layer is, for example, a SiN film having a thickness of about 300 nm.

The optical semiconductor element 1B configured as described above is used, for example, in a state in which the optical semiconductor element 1B is mounted on a wiring board as follows. That is, in a state in which the optical semiconductor element 1B is exposed to a gas atmosphere that is an analysis target, a bias voltage is applied to the quantum cascade laser 30 through the electrode layers 5 and 6, and laser oscillation is caused in the quantum cascade laser 30. Accordingly, laser light emitted from the light emitting surface 30a of the quantum cascade laser 30 is incident on the light incidence surface 40a of the quantum cascade detector 40 through the gas that is an analysis target, and an electrical signal is output from the quantum cascade detector 40 through the electrode layers 7 and 8. In this case, since the dummy region 10 is electrically isolated, the dummy region 10 does not function either as a quantum cascade laser or as a quantum cascade detector. The electrical signal output from the quantum cascade detector 40 is input to a processing circuit at a subsequent stage. In the processing circuit at the subsequent stage, a composition of the gas that is an analysis target is analyzed on the basis of the electrical signal.

It should be noted that when a design value of the oscillation wavelength of the quantum cascade laser 30 is 5.56 μm, a one-side radiation angle θ of the laser light L emitted from the light emitting surface 30a of the quantum cascade laser 30 is 70° or more. On the other hand, when a distance d between the light emitting surface 30a of the quantum cascade laser 30 and the light incidence surface 40a of the quantum cascade detector 40 in the X-axis direction is 125 μm, and a height difference h between the active layer 31 of the quantum cascade laser 30 and the active layer 41 of the quantum cascade detector 40 is 6 μm, a slope angle tan (h/d) between the active layer 31 and the active layer 41 is about 3°. Therefore, the laser light L emitted from the light emitting surface 30a of the quantum cascade laser 30 can be sufficiently incident on the light incidence surface 40a of the quantum cascade detector 40.

[Method of Manufacturing Optical Semiconductor Element of Second Embodiment]

As illustrated in FIGS. 10A and 10B, a step of forming a laminated structure 200 including a first laminated structure 3 and a second laminated structure 4 on a front surface 2a of a semiconductor substrate 2 is performed. More specifically, a contact layer 201, a lower cladding layer 202, an active layer 203, a contact layer 204, a lower cladding layer 205, a lower guide layer 206, an active layer 207, an upper guide layer 208, an upper cladding layer 209, and a contact layer 210 are epitaxially grown sequentially on the front surface 2a of the semiconductor substrate 2 using a molecular beam epitaxy method, an organometallic vapor growth method, or the like so that a laminated structure 200 is formed on the front surface 2a of the semiconductor substrate 2.

The contact layer 201 is a layer including the contact layers 43b and 13b. The lower cladding layer 202 is a layer including the lower cladding layers 42 and 12. The active layer 203 is a layer including the active layers 41 and 11. The contact layer 204 is a layer including the contact layers 43a and 13a.

The lower cladding layer 205 is a layer including the lower cladding layer 33b. The lower guide layer 206 is a layer including the lower guide layer 32b. The active layer 207 is a layer including the active layer 31. The upper guide layer 208 is a layer including the upper guide layer 32a. The upper cladding layer 209 is a layer including the upper cladding layer 33a. The contact layer 210 is a layer including the contact layer 34.

Following the step of forming the laminated structure 200, a step of forming the first laminated structure 3 and the second laminated structure 4 by etching the laminated structure 200 is performed. More specifically, as illustrated in FIGS. 11A and 11B, portions on the front surface sides of the contact layer 210, the upper cladding layer 209, the upper guide layer 208, the active layer 207, the lower guide layer 206, and the lower cladding layer 205 are selectively removed by etching so that a part of the quantum cascade laser 30 of the second laminated structure 4 is formed. Subsequently, as illustrated in FIGS. 12A and 12B, a portion on the back surface side of the lower cladding layer 205 is selectively removed by etching using the contact layer 204 as an etching stop layer so that the front surface of the contact layer 204 is exposed and the quantum cascade laser 30 is formed.

Subsequently, as illustrated in FIGS. 13A and 13B, portions on the front surface sides of the contact layer 204, the active layer 203, and the lower cladding layer 202 are selectively removed by etching so that a part of the quantum cascade detector 40 of the first laminated structure 3 is formed. Subsequently, as illustrated in FIGS. 14A and 14B, a portion on the back surface side of the lower cladding layer 202 is selectively removed by etching using the contact layer 201 as an etching stop layer so that the front surface of the contact layer 201 is exposed and the quantum cascade detector 40 is formed. Subsequently, as illustrated in FIGS. 15A and 15B, the contact layer 201 is divided into the contact layer 43b and the contact layer 13b by selectively removing a part of the contact layer 201 by etching.

Following the step of forming the first laminated structure 3 and the second laminated structure 4, the semiconductor substrate 2 is thinned by removing the portion on the back surface 2b side of the semiconductor substrate 2 as necessary, and an insulating layer is forming to cover the first laminated structure 3 and the second laminated structure 4. Subsequently, the respective electrode layers 5, 6, 7, and 8 are formed on the front surfaces of the respective contact layers 34, 13a, 43a, and 43b through openings formed in the insulating layer by vapor deposition or the like. It should be noted that highly reflective coating may be applied on the reflective surface 30b of the quantum cascade laser 30 and on an end surface of the quantum cascade detector 40 opposite to the light incidence surface 40a. By applying the highly reflective coating on the reflective surface 30b of the quantum cascade laser 30, a mirror loss in the quantum cascade laser 30 can be reduced, internal resonance can be facilitated, and high output can be achieved. In addition, by applying the highly reflective coating on the end surface of the quantum cascade detector 40 opposite to the light incidence surface 40a, light can be confined in the quantum cascade detector 40 and more signals can be detected. Low reflective coating may be applied on the reflective surface 30b of the quantum cascade laser 30. In this case, when an external resonator is configured by disposing a diffraction grating or a reflective mirror at a position facing the reflective surface 30b of the quantum cascade laser 30, reflected light from the diffraction grating or the reflective mirror can be efficiently incident on the active layer of the quantum cascade laser 30. When the diffraction grating is disposed, an arbitrary wavelength can be output by controlling an angle of the diffraction grating with respect to output light.

The optical semiconductor element 1B is obtained by performing each of the above steps. It should be noted that it is possible to perform the above steps at a wafer level and to finally dice the wafer, thereby obtaining a plurality of optical semiconductor elements 1B.

[Operation and Effects of Second Embodiment]

In the optical semiconductor element 1B, in the second laminated structure 4, the quantum cascade laser 30 is provided on the front surface 2a of the semiconductor substrate 2 through the dummy region 10 having the same layer structure as the quantum cascade detector 40. That is, the quantum cascade laser 30 included in the second laminated structure 4 and the quantum cascade detector 40 included in the first laminated structure 3 are located at different heights from the front surface 2a of the semiconductor substrate 2. Therefore, it is possible to achieve optimization of characteristics of the quantum cascade laser 30 and the quantum cascade detector 40. Further, it is easy to match the oscillation wavelength of the quantum cascade laser 30 with the sensitivity wavelength of the quantum cascade detector 40. Furthermore, a degree of freedom of design of each of the quantum cascade laser 30 and the quantum cascade detector 40 is increased.

Further, in the optical semiconductor element 1B, the quantum cascade laser 30 is disposed on the front surface 2a of the semiconductor substrate 2 via the dummy region 10, and the quantum cascade detector 40 is disposed on the front surface 2a of the semiconductor substrate 2. Thus, the side opposite to the semiconductor substrate 2 with respect to the quantum cascade detector 40 is set as a space such that it is possible to prevent the laser light emitted from the quantum cascade laser 30 from being reflected by the first laminated structure 3 and returning to the quantum cascade laser 30.

Further, in the optical semiconductor element 1B, the active layer 41 of the quantum cascade detector 40 is electrically connected to each of the contact layers 43a and 43b. The active layer 31 of the quantum cascade laser 30 is electrically connected to each of the contact layer 34 and the contact layer 13a corresponding to the contact layer 43a in the dummy region 10. Accordingly, since the contact layer 43a of the first laminated structure 3 and the contact layer 13a of the second laminated structure 4 can be formed of the same layer at the time of manufacturing the optical semiconductor element 1B, it is possible to facilitate the manufacturing.

Further, in the optical semiconductor element 1B, the electrode layer 7 is provided on the front surface of the contact layer 43a, the electrode layer 8 is provided in the region 43s in which the portion configured as the ridge structure is not provided on the front surface of the contact layer 43b, the electrode layer 5 is provided on the front surface of the contact layer 34, and the electrode layer 6 is provided in the region 13s in which the portion configured as the ridge structure is not provided on the surface of the contact layer 13a. Thus, it is possible to reliably apply a voltage to each of the active layer 41 and the active layer 31 while simplifying a structure of the optical semiconductor element 1B.

Further, in the optical semiconductor element 1B, the light incidence surface 40a of the quantum cascade detector 40 is a surface inclined with respect to the resonance direction A of the quantum cascade laser 30. Thus, it is possible to prevent the laser light emitted from the quantum cascade laser 30 from being reflected by the light incidence surface 40a of the quantum cascade detector 40 and returning to the quantum cascade laser 30.

Further, in the method of manufacturing the optical semiconductor element 1B, the laminated structure 200 including the first laminated structure 3 and the second laminated structure 4 is formed on the front surface 2a of the semiconductor substrate 2, and the laminated structure 200 is etched to form the first laminated structure 3 and the second laminated structure 4. Accordingly, it is possible to achieve optimization of characteristics of each of the quantum cascade laser 30 and the quantum cascade detectors 40. Further, since monolithic fabrication can be achieved through a semiconductor manufacturing process, it is possible to obtain the optical semiconductor element 1B in which positional accuracy of the quantum cascade laser 30 and the quantum cascade detector 40 is very high.

Modification Example

Although the first embodiment and the second embodiment of the present disclosure have been described above, the present disclosure is not limited to the above-described embodiments. For example, the layer structures of the quantum cascade laser 30 and the quantum cascade detector 40 are not limited to the structures described above. Further, the quantum cascade structures of the active layers 31 and 41 are not limited to the quantum cascade structures described above. In addition, since the diffraction grating layer is provided in the portion opposite to the semiconductor substrate 2 in the quantum cascade laser 30, the quantum cascade laser 30 may be configured as a distributed feedback (DFB) type element. In this case, it is possible to cause the quantum cascade laser 30 to oscillate in a single mode. Further, the analysis target of each of the optical semiconductor elements 1A and 1B is not limited to a gas and may be liquid or the like. Usage examples of the optical semiconductor elements 1A and 1B are not limited to the examples described above.

Figure 16:
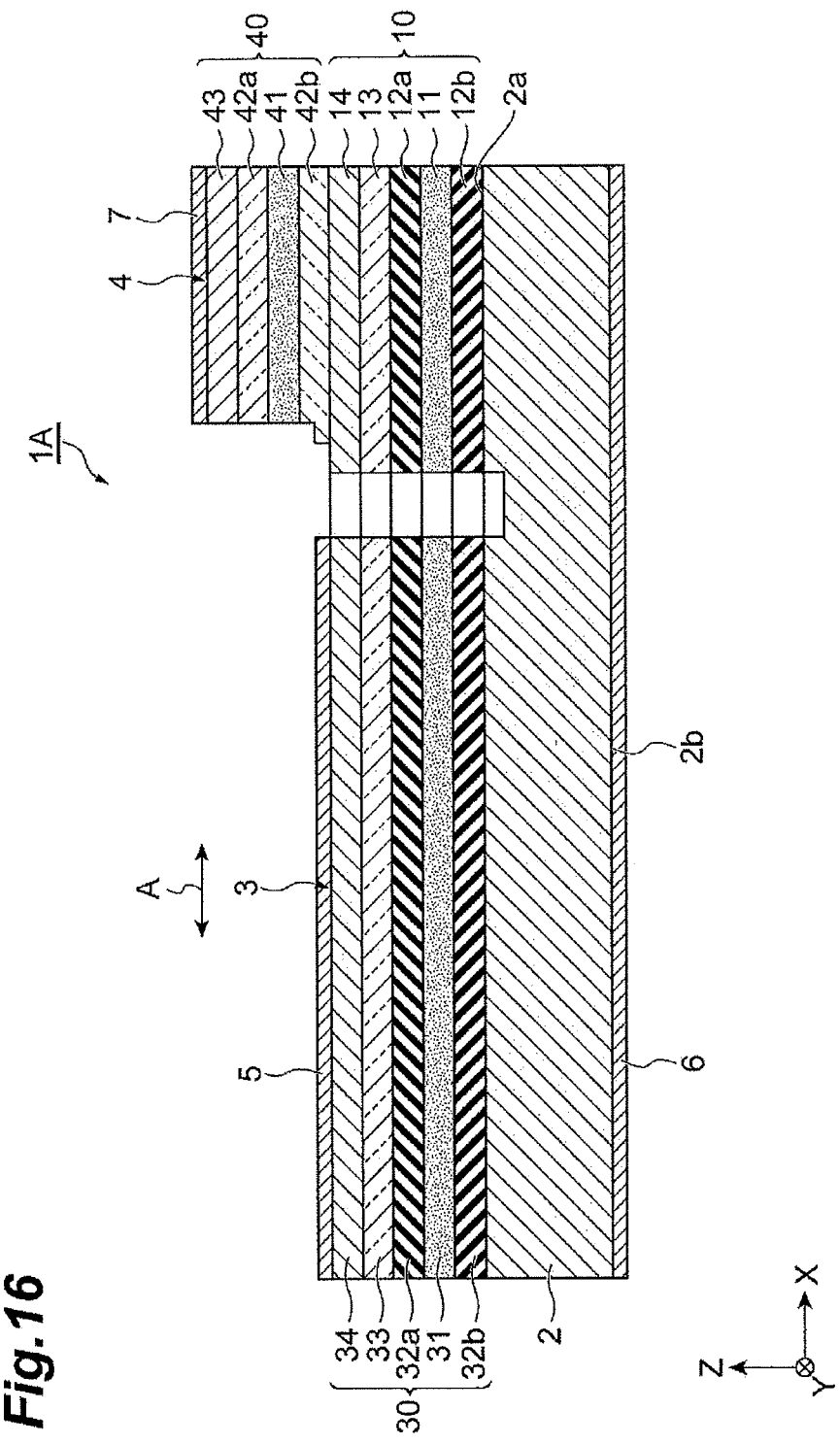
FIG. 16 is a cross-sectional view of a modification example of the optical semiconductor element of the first embodiment.
Figure 17:
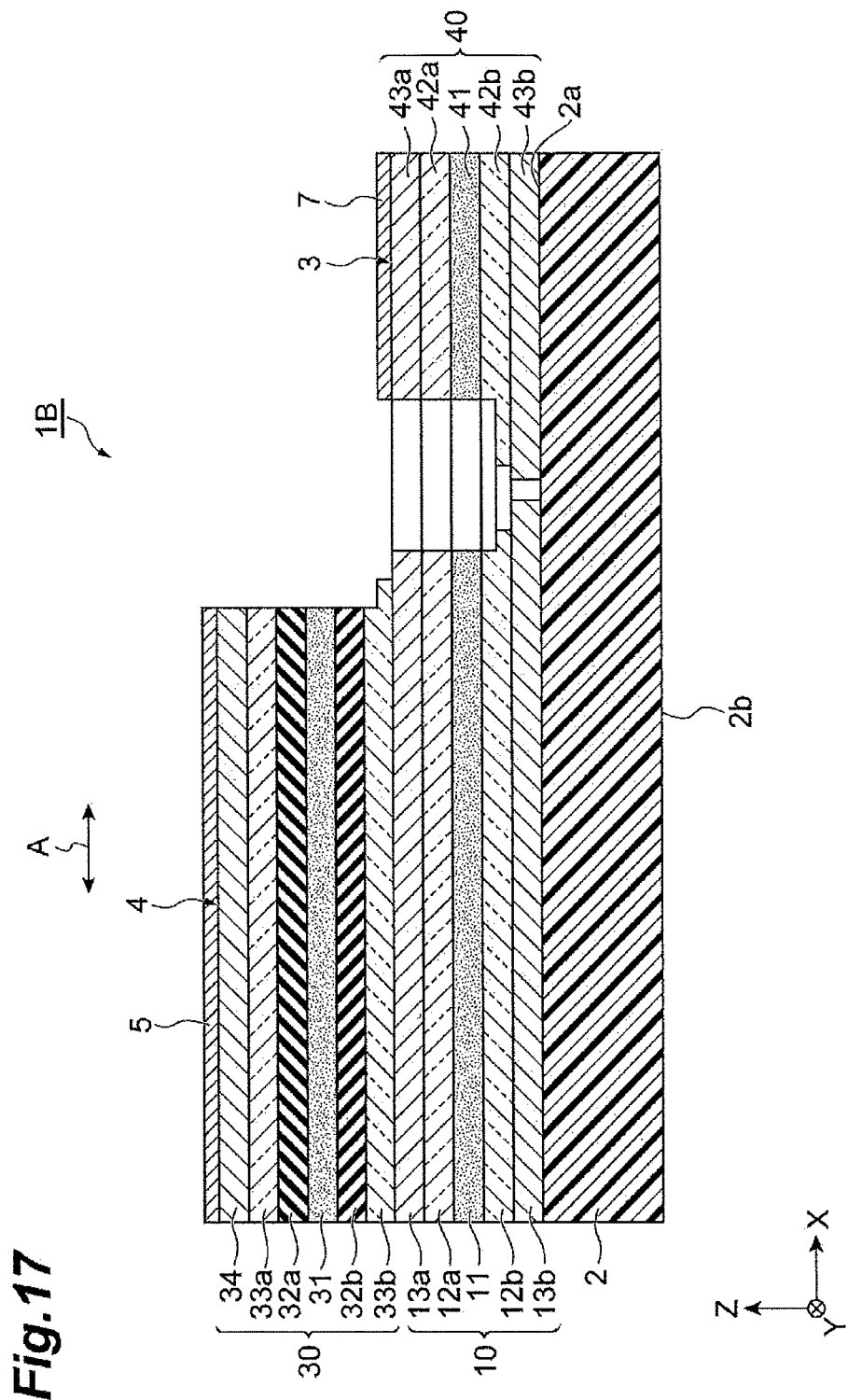
FIG. 17 is a cross-sectional view of a modification example of the optical semiconductor element of the second embodiment.

Further, as illustrated in FIG. 16, in the second laminated structure 4 of the optical semiconductor element 1A of the first embodiment, an upper cladding layer 42a and a lower cladding layer 42b may be provided on both sides of the active layer 41. Further, as illustrated in FIG. 17, in the first laminated structure 3 of the optical semiconductor element 1B of the second embodiment, an upper cladding layer 42a and a lower cladding layer 42b may be provided on both sides of the active layer 41. As described above, a waveguide structure is applied to the quantum cascade detector 40 so that laser light incident on the quantum cascade detector 40 is absorbed by the active layer 41 while propagating inside a waveguide structure. Accordingly, it is possible to increase a photocurrent to be taken out.

Figure 18A:
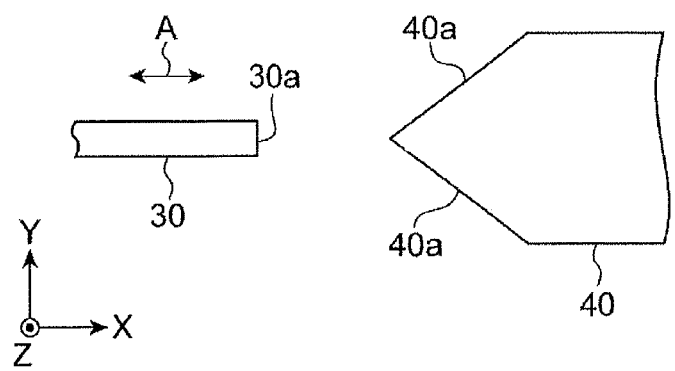
FIGS. 18A, 18B and 18C is a schematic diagram illustrating a relationship between a resonance direction of the quantum cascade laser and a light incidence surface of a quantum cascade detector.
Figure 18B:
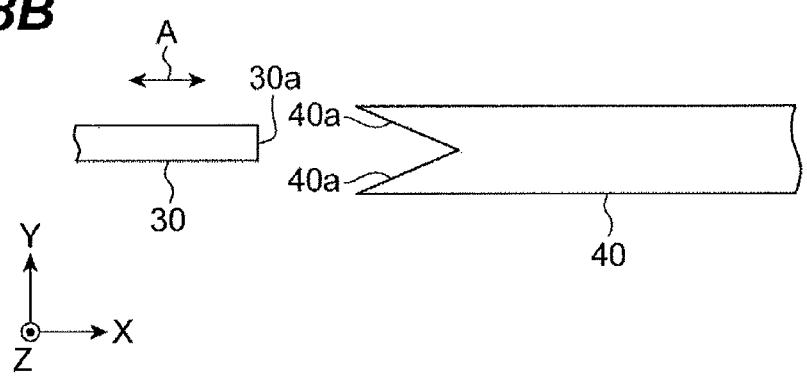
Figure 18C:
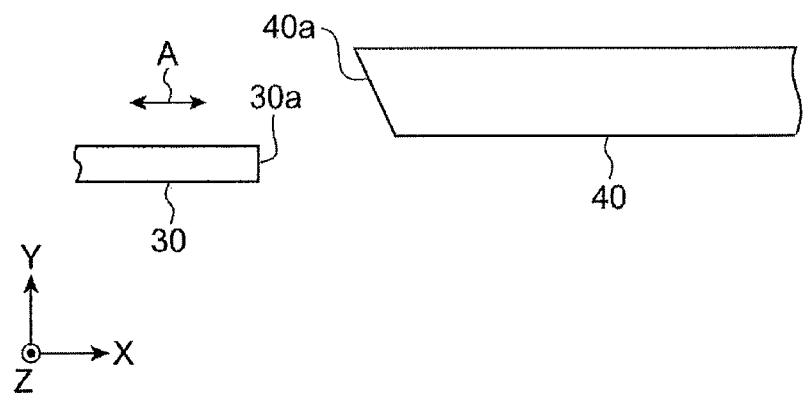

Further, as illustrated in FIGS. 18A and 18B, the quantum cascade detector 40 may include a plurality of light incidence surfaces 40a inclined with respect to the resonance direction A of the quantum cascade laser 30. FIG. 18A illustrates an example in which a pair of light incidence surfaces 40a are connected to each other to be convex with respect to the light emitting surface 30a of the quantum cascade laser 30. FIG. 18B illustrates an example in which a pair of light incidence surfaces 40a are connected to each other to be concave with respect to the light emitting surface 30a of the quantum cascade laser 30. Further, as illustrated in FIG. 18C, the light incidence surface 40a of the quantum cascade detector 40 may be shifted in a direction (that is, the Y-axis direction) parallel to the front surface 2a of the semiconductor substrate 2 and perpendicular to the resonance direction A of the quantum cascade laser 30. That is, a center of the light incidence surface 40a of the quantum cascade detector 40 may be shifted from a center of the light emitting surface 30a of the quantum cascade laser 30 in the Y-axis direction. In this case, it is possible to prevent the laser light emitted from the quantum cascade laser 30 from being reflected by the light incidence surface 40a of the quantum cascade detector 40 and returning to the quantum cascade laser 30.

In each of the above embodiments, a distance between the light emitting surface 30a of the quantum cascade laser 30 and the light incidence surface 40a of the quantum cascade detector 40 is, for example, about hundreds of μm. Therefore, it is very difficult, for example, for nonreflective coating made of a dielectric multi-layered film to be applied on the light incidence surface 40a of the quantum cascade detector 40. In such a circumstance, it is important to prevent the laser light from returning to the quantum cascade laser 30 by causing the light emitting surface 30a of the quantum cascade laser 30 to be inclined with respect to the resonance direction A of the quantum cascade laser 30 and causing the light emitting surface 30a of the quantum cascade laser 30 to be shifted with respect to the resonance direction A of the quantum cascade laser 30. In particular, the prevention is very important since stable signal-mode oscillation is obtained when the quantum cascade laser 30 is configured as a DFB-type element.

According to the present disclosure, it is possible to provide an optical semiconductor element and a method of manufacturing an optical semiconductor element capable of achieving optimization of characteristics of each of the quantum cascade laser and the quantum cascade detector.

What is claimed is:

1. An optical semiconductor element comprising:
a semiconductor substrate;
a first laminated structure provided on a front surface of the semiconductor substrate; and
a second laminated structure provided on the front surface of the semiconductor substrate,
wherein the first laminated structure includes a first quantum cascade region having a layer structure,
the second laminated structure includes (i) a dummy region having the same layer structure as the first quantum cascade region and (ii) a second quantum cascade region provided on the front surface of the semiconductor substrate with the dummy region disposed therebetween, and
one of the first quantum cascade region and the second quantum cascade region is a quantum cascade laser, and the other of the first quantum cascade region and the second quantum cascade region is a quantum cascade detector.

2. The optical semiconductor element according to claim 1, wherein the first quantum cascade region is the quantum cascade laser, and the second quantum cascade region is the quantum cascade detector.

3. The optical semiconductor element according to claim 2,
wherein the semiconductor substrate is an n-type or p-type semiconductor substrate,
the first quantum cascade region includes a first active layer and a first contact layer provided on a side opposite to the semiconductor substrate with respect to the first active layer,
the second quantum cascade region includes a second active layer and a second contact layer provided on a side opposite to the semiconductor substrate with respect to the second active layer,
the first active layer is electrically connected to each of the first contact layer and the semiconductor substrate, and the second active layer is electrically connected to each of the second contact layer and a third contact layer corresponding to the first contact layer in the dummy region.

4. The optical semiconductor element according to claim 3, further comprising:
a first electrode layer provided on a front surface of the first contact layer;
a second electrode layer provided on a back surface of the semiconductor substrate;
a third electrode layer provided on a front surface of the second contact layer; and
a fourth electrode layer provided in a region in which a portion on the second contact layer side relative to the third contact layer is not provided on a front surface of the third contact layer due to the portion being configured as a ridge structure.

5. The optical semiconductor element according to claim 1, wherein the first quantum cascade region is the quantum cascade detector, and the second quantum cascade region is the quantum cascade laser.

6. The optical semiconductor element according to claim 5,
wherein the semiconductor substrate is a semi-insulating substrate,
the first quantum cascade region includes a first active layer, a first contact layer provided on a side opposite to the semiconductor substrate with respect to the first active layer, and a second contact layer provided on the semiconductor substrate side with respect to the first active layer,
the second quantum cascade region includes a second active layer and a third contact layer provided on the side opposite to the semiconductor substrate with respect to the second active layer,
the first active layer is electrically connected to each of the first contact layer and the second contact layer, and
the second active layer is electrically connected to each of the third contact layer and a fourth contact layer corresponding to the first contact layer in the dummy region.

7. The optical semiconductor element according to claim 6, further comprising:
a first electrode layer provided on a front surface of the first contact layer;
a second electrode layer provided in a region in which a portion on the first contact layer side relative to the second contact layer is not provided on a front surface of the second contact layer due to the portion being configured as a ridge structure;
a third electrode layer provided on a front surface of the third contact layer; and
a fourth electrode layer provided in a region in which a portion on the third contact layer side relative to the fourth contact layer is not provided on a front surface of the fourth contact layer due to the portion being configured as a ridge structure.

8. The optical semiconductor element according to claim 1, wherein a light incidence surface of the quantum cascade detector is a surface inclined with respect to a resonance direction of the quantum cascade laser.

9. The optical semiconductor element according to claim 2, wherein a light incidence surface of the quantum cascade detector is a surface inclined with respect to a resonance direction of the quantum cascade laser.

10. The optical semiconductor element according to claim 5, wherein a light incidence surface of the quantum cascade detector is a surface inclined with respect to a resonance direction of the quantum cascade laser.

11. The optical semiconductor element according to claim 1, wherein a light incidence surface of the quantum cascade detector is shifted in a direction parallel to the front surface of the substrate and perpendicular to a resonance direction of the quantum cascade laser.

12. The optical semiconductor element according to claim 2, wherein a light incidence surface of the quantum cascade detector is shifted in a direction parallel to the front surface of the substrate and perpendicular to a resonance direction of the quantum cascade laser.

13. The optical semiconductor element according to claim 5, wherein a light incidence surface of the quantum cascade detector is shifted in a direction parallel to the front surface of the substrate and perpendicular to a resonance direction of the quantum cascade laser.

14. A method of manufacturing an optical semiconductor element according to claim 1, the method comprising:
a step of forming a laminated structure including the first laminated structure and the second laminated structure on the front surface of the semiconductor substrate; and
a step of forming the first laminated structure and the second laminated structure by performing etching on the laminated structure.

15. A method of manufacturing an optical semiconductor element according to claim 2, the method comprising:
a step of forming a laminated structure including the first laminated structure and the second laminated structure on the front surface of the semiconductor substrate; and
a step of forming the first laminated structure and the second laminated structure by performing etching on the laminated structure.

16. A method of manufacturing an optical semiconductor element according to claim 5, the method comprising:
a step of forming a laminated structure including the first laminated structure and the second laminated structure on the front surface of the semiconductor substrate; and
a step of forming the first laminated structure and the second laminated structure by performing etching on the laminated structure.

* * * * *